United States Patent [19]

Yoshida et al.

[11] Patent Number: 4,599,576

[45] Date of Patent: Jul. 8, 1986

[54] INSULATED GATE TYPE FIELD EFFECT SEMICONDUCTOR DEVICE AND A CIRCUIT EMPLOYING THE DEVICE

[75] Inventors: Isao Yoshida, Tokyo; Takeaki Okabe, Kokubunji; Shikayuki Ochi, Akishima; Hidefumi Ito; Masatomo Furumi, both of Takasaki; Masaru Takeuchi, Tokyo; Minoru Nagata, Kodaira, all of Japan

[73] Assignee: Hitachi, Ltd., Tokyo, Japan

[21] Appl. No.: 882,625

[22] Filed: Mar. 1, 1978

[30] Foreign Application Priority Data

Apr. 15, 1977 [JP] Japan ................. 52-42651

[51] Int. Cl.⁴ .................. H01L 29/78; H03F 3/18; H03F 3/16
[52] U.S. Cl. .................. 330/264; 357/23.8; 357/42; 357/51; 307/304
[58] Field of Search .......... 330/264; 357/23, 41, 357/13, 89, 90, 53, 42, 75, 81, 23.8, 23.1; 307/304

[56] References Cited

U.S. PATENT DOCUMENTS

| | | | |
|---|---|---|---|
| 3,440,500 | 4/1969 | Coppen | 357/86 |
| 4,005,450 | 1/1977 | Yoshida et al. | 357/23 |
| 4,021,751 | 5/1977 | Suzuki | 330/264 |
| 4,057,764 | 11/1977 | Yokoyama | 330/264 |
| 4,058,822 | 11/1977 | Awane et al. | 357/23 |
| 4,079,504 | 3/1978 | Kosa | 357/23 |
| 4,092,661 | 5/1978 | Watrous, Jr. | 357/23 |
| 4,154,626 | 5/1979 | Joy et al. | 357/23 |
| 4,172,260 | 10/1979 | Okabe et al. | 357/23 |

FOREIGN PATENT DOCUMENTS 2027452  9/1970  France.

OTHER PUBLICATIONS

RCA COS/MOS Integrated Circuits Manual (RCA, Somerville, N.J., 1971, Tech. Series CMS-270), pp. 24–26 (exr's personal copy).

Primary Examiner—William D. Larkins
Attorney, Agent, or Firm—Antonelli, Terry & Wands

[57] ABSTRACT

An insulated gate type field effect transistor for high power which has a low conductivity region surrounding a drain region and an offset gate region having a further lower conductivity adjoined thereto, wherein the length and impurity concentration are designed according to the electric characteristics of the transistor. A combination of P channel and N channel type transistors having substantially the same electric characteristics and an audio amplifying circuit using the combination are also disclosed.

8 Claims, 48 Drawing Figures

N CHANNEL MOSFET

P CHANNEL MOSFET

INSULATED GATE TYPE FIELD EFFECT SEMICONDUCTOR DEVICE AND A CIRCUIT EMPLOYING THE DEVICE

LIST OF PRIOR ART (37 CFR 1.56 (A))

The following references are cited to show the state of the art:
(1) U.S. Pat. No. 3,533,158, R. W. Bower, Oct. 13, 1970, Class 29-571.
(2) U.S. Pat. No. 3,534,235, R. W. Bower et al, Oct. 13, 1970, Class 317-235.
(3) U.S. Pat. No. 3,615,934, R. W. Bower, Oct. 26, 1971, Class 148-186.
(4) U.S. Pat. No. 3,909,306, T. Sakamoto et al, Sept. 30, 1975, Class 148-1.5.
(5) R. W. Bower et al, IEEE Transactions on Electron Devices, Vol. ED-15, No. 10, October 1968, PP. 757-761.

BACKGROUND OF THE INVENTION

This invention relates to an insulated gate type field effect semiconductor device, especially an insulated gate field-effect transistor (abbreviated to IGFET hereinbelow) for high power, a circuit employing the devices, and a method for manufacturing the device.

IGFET's generally termed MOS (metal Oxide Semiconductor) FET's have heretofore been mainly used in LSI's for desk-top calculators etc. as switching elements of low voltages of below 10–20 V and low currents of below several mA.

As the result of research by the inventors to be described later, however, it has been revealed that IGFET's are desirably applied, not only to such uses of low voltages and low currents as has been the case up to now, but also to uses of high voltages and high currents.

The drain current of the IGFET has a negative temperature coefficient in a range of comparatively large values thereof, and does not have a positive temperature coefficient as in the collector current of a bipolar transistor. Therefore, even when a potential difference is generated on a semiconductor pellet of large area by a current flowing to an electrode, the current crowding phenomenon does not occur. Accordingly, there is little tendency for destruction due to thermal runaway to occur. The IGFET has a high input impedance, and moreover, the drain current is proportional to the square of the gate—source voltage and scarcely includes components of higher orders. It has accordingly been revealed that, when compared with the bipolar transistor, the IGFET attains a higher power gain and exhibits a characteristic of lower distortion factor.

In the IGFET, the drain current—versus—drain voltage characteristic exhibits a saturation characteristic or the so-called pentode characteristic. Therefore, the IGFET presents a better characteristic against the fluctuation of the supply voltage than a vertical type field effect transistor in which the drain current exhibits a non-saturation characteristic. In the IGFET, the values and range of the gate—source cutoff voltage can be selected far more freely than in a junction type field effect transistor. It has been revealed that a fluctuation in the gate—source capacitance and a fluctuation in the gate—drain capacitance ascribable to fluctuations in the gate voltage, the drain voltage, etc. are less in the IGFET than in the junction type field effect transistor.

SUMMARY OF THE INVENTION

An object of this invention is to provide an IGFET which exhibits a high breakdown voltage.

Another object of this invention is to provide an IGFET capable of controlling a high current.

Another object of this invention is to provide an IGFET which exhibits a high breakdown voltage and high current, that is, high power.

Another object of this invention is to provide an IGFET of optimized characteristics.

Another object of this invention is to provide an IGFET suitable for an audio power amplifier circuit device.

Another object of this invention is to provide an IGFET which can be fabricated on a semiconductor chip of smaller size.

Another object of this invention is to provide an IGFET which has an increased current capacity.

Still another object of this invention is to provide an IGFET of high breaking strength.

Yet another object of this invention is to provide an IGFET of simple interconnections on a semiconductor chip.

A further object of this invention is to provide an IGFET of stable characteristics.

A still further object of this invention is to provide an IGFET which has a reduced drain capacitance.

A yet further object of this invention is to provide an IGFET which has an appropriate protective element.

Another object of this invention is to provide a method of manufacture suitable for an IGFET.

Another object of this invention is to provide IGFET's of small dispersion.

Another object of this invention is to provide an IGFET of simple assemblage.

Another object of this invention is to provide an IGFET capable of simplifying a bias circuit.

Another object of this invention is to provide IGFET's of complementary construction as exhibit excellent pair characteristics.

A further object of this invention is to provide N-channel and P-channel type IGFET's between which electrical characteristics such as the breakdown voltage, the allowable current and the mutual conductance are uniform.

A further object of this invention is to provide an IGFET suitable for a source follower circuit.

A still further object of this invention is to provide an audio high output device which has excellent electrical characteristics and whose circuit arrangement is comparatively simple.

A yet further object of this invention is to provide an IFGET convenient for actual installation.

According to this invention, the following various aspects are considered.

According to one aspect of this invention, an insulated gate type field effect device comprises a semiconductor body of a first conductivity type having a major surface, a pair of first and second semiconductor regions of a second conductivity type opposite to the first conductivity type formed in said body extending to the major surface, a third semiconductor region of the second conductivity type adjacent to said second region formed in said body extending to the major surface so as to surround the second region with an impurity concentration lower than said first and second regions, a fourth semiconductor region of the second conductivity type adjacent to said third region formed partially in the major surface between said third and first regions with an impurity concentration further lower than said third region and a depth shallower than said first and second regions, an insulating film formed on the major surface including the surface of said body between said fourth and first regions, and a gate electrode formed on said insulating film so as to cover the surface of said body between said fourth and first regions.

According to another feature of the invention, an insulated gate field effect device as above further comprises a second insulating film covering the surface of said gate electrode, a source electrode connected to said first region and extending over said second insulating film so as to cover the edge portion of said fourth region and the vicinity thereof, and a drain electrode connected to said second region.

According to another feature, in the insulated gate field effect device said drain electrode extends over the insulating film formed on the surface of said third region so as to cover at least a part of the major surface of said fourth region.

According to another feature, in the insulated gate field effect device said body further has a heavily doped fifth semiconductor region of the first conductivity type lying under said third semiconductor region.

According to another feature, the high power insulated gate field effect transistor comprises a semiconductor body of a first conductivity type having a major surface, a heavily doped first semiconductor region of a second conductivity type formed in said body extending to the major surface and having a center portion and a plurality of finger portions connected to the center portion a low doped second semiconductor region of the second conductivity type having a depth deeper than said first region formed in said body so as to wholly surround said first region and extend to the major surface adjacent to said first region, a further low doped third semiconductor region of the second conductivity type having a depth shallower than said first region formed in said major surface adjacent to said second region with a predetermined constant width from the whole outline of said second region, a plurality of heavily doped fourth semiconductor regions of the second conductivity type having substantially same depth as said first region respectively provided in said body at the surface space between said finger portions and at the sides of the edge finger portions separated from said third region with a predetermined constant distance, an insulating film formed on the major surface of said body including the surface between said third and fourth region, a gate electrode provided on said insulating film so as to cover the surface of said body between said third and fourth region a drain electrode connected to each finger portion of said first region, and a source electrode connected to each fourth regions and extending over said insulating film.

Another feature is high power insulated gate field effect transistor wherein said center portion of said first region has a ring shape, the inside thereof exposing the major surface of said body of the first conductivity type which is covered by an insulating film, and said drain electrode extends over the last mentioned insulating film and makes a bonding pad area for connecting a conductive wire thereto over the inside area defined by said ring of said first region.

Still another feature is the combination of a P channel type insulated gate type field effect transistor and an N channel type insulated gate type field effect transistor having substantially same electric characteristics except for the polarity thereof, each transistor having a source and a drain region formed in a semiconductor body, a low doped offset gate region of the same conductivity type as said drain region formed in the major surface of the body between the source and drain regions adjacent to the drain region, an insulating film formed on the major surface of said body, and a gate electrode formed on said insulating film so as to cover the major surface lying between said source region and said offset gate region and defining a channel area of the transistor, wherein the length of said offset gate region and the channel width of said N channel type transistor are made respectively larger and smaller than that of said P channel type transistor.

A further feature of the above is that said body for said N channel type transistor has further a low resistivity semiconductor region lying under said source and drain regions.

Another feature is a circuit comprising a P channel type insulated gate field effect transistor and an N channel type insulated gate field effect transistor, each transistor having a source and a drain region formed in a semiconductor body, a low doped offset gate region of the same conductivity type as said drain region formed in a major surface of said body ajacent said drain region, a source electrode connected to said source region, a drain electrode connected to said drain region, a gate electrode formed on an insulating film covering the major surface defining the channel of the transistor between said source region and said offset gate region, and a substrate electrode means provided to said body, connecting means for directly connect said source electrodes and substrate electrodes of said both transistors in common to an output terminal, bias adjusting means connected to said gate electrodes of said transistors, and means for applying an input signal to the gate electrodes coupled to said gate electrodes.

A further feature of the above circuit is that said N channel type transistor has a length of said offset gate region longer and a channel width smaller than said P channel type transistor.

Another feature is an audio amplifier comprising a P channel type insulated gate field effect transistor and an N channel type insulated gate field effect transistor, each transistor having a source and a drain electrode and an insulated gate electrode, connecting means said source electrodes of both transistors in common to an output terminal, bias adjusting means connected to said gate electrodes of both transistors, means for supplying an input signal to said gate electrodes, and connecting means for connecting an audio speaker to said output terminal.

A further feature of the audio amplifier is that said each transistor has an offset gate regions in a semiconductor body and said N channel type transistor has a length of said offset gate region longer and a channel width smaller than said P channel type transistor.

Another feature is an insulated gate field effect transistor comprising a semiconductor body, a conductive support member for supporting said body, said body having a source and a drain region of a conductivity type opposite to that of said body formed in the major surface of said body, and a low doped offset gate region of the same conductivity type as said drain region formed in the major surface of said body adjacent to said drain region, a source electrode connected to said source region, a drain electrode connected to said drain region, a gate electrode formed on an insulating film covering the major surface of said body between said source region and said offset gate region, a first connecting means for connecting said source electrode to said conductive support member, a second connecting means for connecting said drain electrode to a first conductive means fixed to said support member and electrically isolated therefrom, and a third connecting means for connecting said gate electrode to a second conductive means fixed to said support member and electrically isolated therefrom.

Still another feature is semiconductor device assembly for a P channel type insulated gate field effect transistor and an N channel type insulated gate field effect transistor, each transistor having a semiconductor body, a source and a drain region formed therein, an offset gate region formed in the major surface of said body adjacent to said drain region, a source and a drain electrode respectively connected to said source and drain regions, and a gate electrode formed on an insulating film covering the major surface of said body between said source and said offset gate region, a common conductive substrate for supporting said both semiconductor bodies, and connecting means for connecting said source electrodes of said both transistors to said conductive substrate in common.

A further feature is a gate protective means for an insulated gate field effect device comprising a semiconductor body of a first conductivity type having a major surface, a plurality of first semiconductor regions of a second conductivity type formed in said body extending to said major surface, a second semiconductor region of the first conductivity type with an impurity concentration higher than said body formed in said major surface along the boundaries between said first regions and the surface of said body adjacent thereto so as to substantially surround said first regions at the surface, a plurality of third semiconductor regions of the first conductivity type with an impurity concentration substantially same as said second region respectively formed in the major surfaces of said first regions, an insulating film covering the major surface of said body, a conductive means connected to said third regions extending over said insulating film and connected to a gate electrode of an insulated gate field effect device provided in another portion of said major surface of said body.

Another feature is a method for manufacturing an insulated gate field effect transistor comprising the steps of selectively forming a first semiconductor region in a semiconductor body having a major surface, covering the major surface of said body with a first insulating film, selectively removing the insulating film on the surface of the first region and the vicinity thereof, forming a second thin insulating film on the exposed surface, depositing a silicon layer on said first and second insulating film, removing said silicon layer except for a portion on the second insulating film for a gate electrode, introducing an impurity in the major surface of said body by ion-implantation using said remaining silicon layer and said remaining first insulating film so as to form an offset gate region in the surface adjacent to said first region, and then selectively introducing an impurity into said surface of said first region and the surface of said body not covered by said remaining silicon layer so as to respectively form a drain region and a source region.

A further feature of this method further comprises the step of introducing another impurity into said deposited silicon layer before the step of selectively removing the silicon layer.

The above-mentioned various objects of this invention and further objects thereof will become apparent from the following description and the accompanying drawings.

In conformity with this invention, to the end of preventing the crowding of electric fields at the edge of a gate electrode and thereby achieving a high breakdown voltage, an offset gate structure is employed.

PREFERRED EMBODIMENTS OF THE INVENTION

Figure 1:
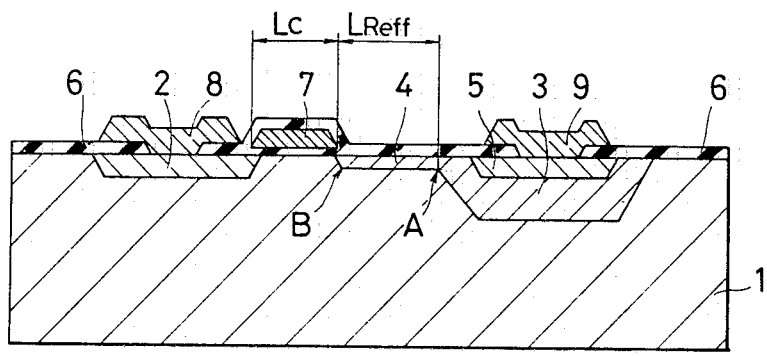
FIGS. 1 to 3 are sectional views of the essential portions of semiconductor devices according to this invention.

FIG. 1 shows a sectional view of a P-channel enhancement type IGFET of the offset gate structure. Referring to the figure, numeral 1 designates an N-type silicon substrate, numeral 2 a P-type source region, numeral 3 a P-type drain intermediate region, numeral 4 a high resistance region or the so-called offset gate region which connects with the drain intermediate region, numeral 5 a P-type drain region of high impurity concentration for connection to an electrode 9, and numeral 6 a silicon oxide film. Shown at 7 is a gate electrode which is formed on the surface of the silicon substrate 1 between the source and drain regions, that is, a channel region through a thin gate insulating film and which is made of, for example, polycrystalline silicon. A source electrode 8 lies in contact with the source region 2 through an opening provided in the oxide film 6 and is made of a metal such as aluminum, while the drain electrode 9 lies in contact with the drain region 5 through an opening provided in the oxide film 6. The gate electrode 7 extends over a thick portion of the oxide film 6, and an aluminum electrode contacts the extension portion through an opening provided in the oxide film covering the gate electrode.

In the IGFET of FIG. 1, the silicon substrate 1 has a resistivity of 5Ω cm, and the drain intermediate region 3 has a P-type impurity concentration of $5 \times 10^{16}/cm^3$. The high resistivity region 4 is formed by, for example, the technique of ion implantation of a P-type impurity. The source region 2 and the drain region 5 are formed by, for example, the technique of selective diffusion of an impurity.

The thickness of the gate silicon oxide film is, for example, about 1,300Å, and the gate electrode length $L_C$ is 8 μm.

The IGFET of this structure can be fabricated with good precision by a smaller number of manufacturing steps than those for well-known IGFET's termed "V-MOS" and "DSAMOS" devices.

Regarding the IGFET of FIG. 1, it has been noticed that the source-drain breakdown voltage varies reliably depending on the quantity of ion implantation of the impurity for forming the high resistivity region 4. The relationship between the quantity of impurity ion implantation $N_{DS}$ and the source-drain breakdown voltage $BV_{DS}$ is shown by a curve A in FIG. 6. As apparent from the illustration, the drain breakdown voltage has a peak value. The peak characteristic is accounted for by the fact that in case where the quantity of impurity ion implantation is small, the resistivity of the high resistivity region 4 is high, whereby the electric field crowding in the semiconductor takes place at an edge A of the drain intermediate region 3 in FIG. 1, and the fact that in case where the implantation quantity of the impurity ions is increased beyond an appropriate value, the field moderating effect in the high resistivity region 4 decreases, whereby the field crowding takes places at an edge of the high resistivity region 4 as indicated by B in FIG. 1.

Figure 6:
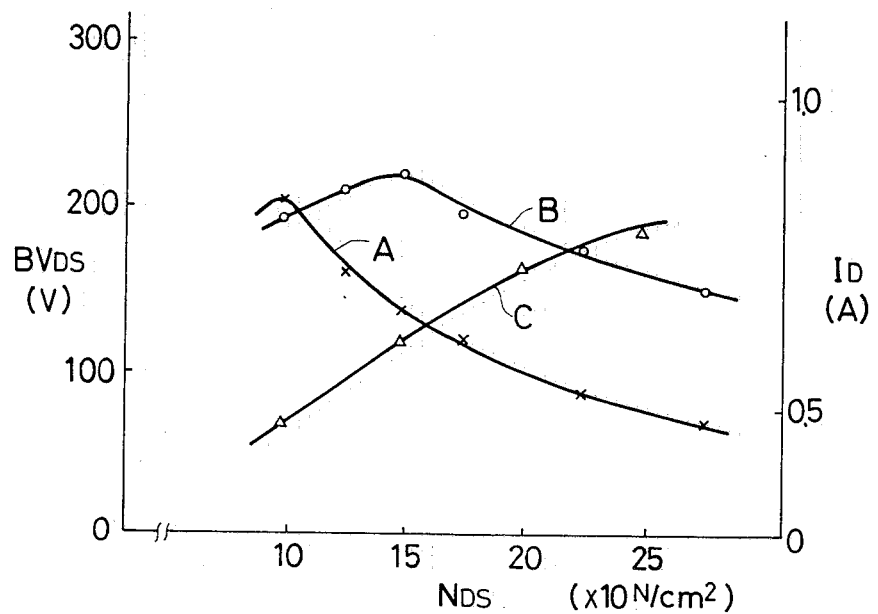

As to the IGFET of the offset gate structure in FIG. 1, it has also been noticed that the allowable drain current per unit gate width varies depending on the quantity of impurity into the high resistivity semiconductor region 4. A curve C in FIG. 6 illustrates the relationship between the quantity of impurity ion implantation $N_{DS}$ and the allowable drain current $I_D$. The allowable drain current increases with the increase in the quantity of ion implantation. The allowable drain current is limited by the resistance of the high resistivity region 4. Accordingly, by increasing the implantation quantity of the impurity ions, the allowable drain current increases because the resistance of the high resistivity region 4 decreases.

Figure 4:
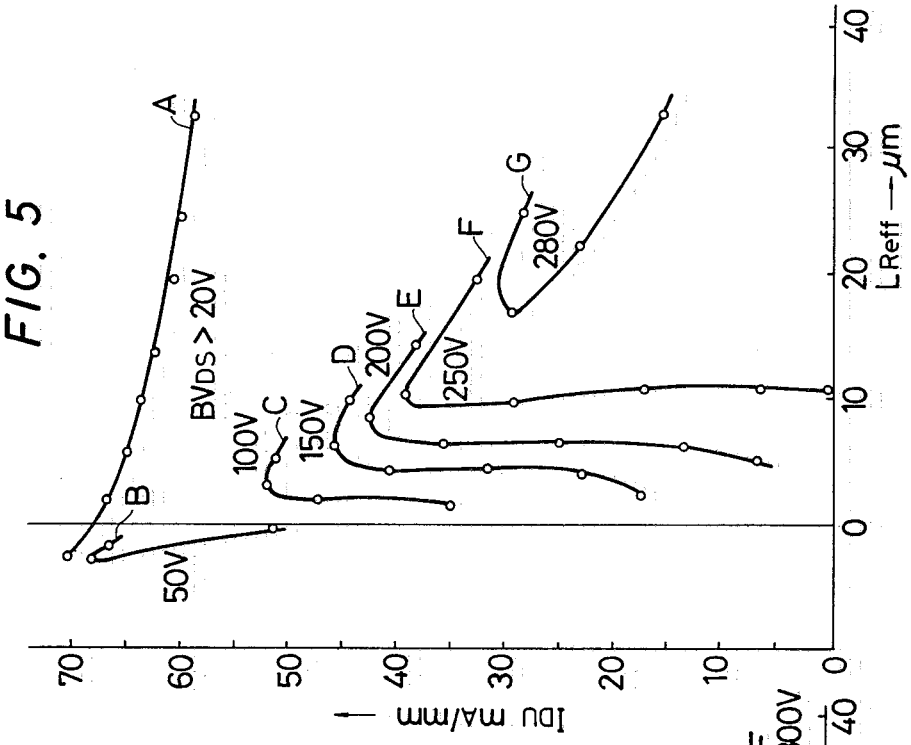
FIGS. 4 to 6 are diagrams of characteristic curves for explaining the semiconductor devices of this invention.

As regards the IGFET of FIG. 1, it has further been noticed that at a predetermined drain breakdown voltage, the allowable drain current varies reliably depending on the offset gate length $L_{Reff}$. Curves A through F in FIG. 4 illustrate the relations between the allowable drain current per unit gate width $I_{DU}$ and the offset gate length $L_{Reff}$ as were obtained when the offset gate (high resistivity region 4) was formed by the ion implantation of boron at an energy of 80 KeV, the quantity of the implantation being varied in a range of 0 to $10^{13}$ atoms/cm$^2$. Here, the gate width in the IGFET of FIG. 1 shall be defined as the length of a portion which opposes the source region 2 and the high resistivity region 4.

The curves A and B in FIG. 4 signify that a drain breakdown voltage of 50 V to 100 V is attained even when the offset length $L_{Reff}$ is negative, that is, when the edge of the drain intermediate region 3 extends under the gate electrode 7.

It is apparent from the curves A through F in FIG. 4 that, in the IGFET of the offset gate structure, the allowable drain currents per unit gate width exhibit the maximum values with the variations of the offset gate length $L_{Reff}$ at the respective predetermined drain-source breakdown voltages.

As to the IGFET of FIG. 1, it has been revealed that, in accordance with the characteristics given by the curves A to F in FIG. 4, the range of the offset gate length $L_{Reff}$ can be selected at each drain-gate breakdown voltage so as to bring the allowable drain current value per unit gate width into the vicinity of the maximum value, so that it is possible to minimize the gate width for causing the flow of a drain current required at this time.

Ordinarily, in order to attain a necessary gate width in an IGFET, a semiconductor chip requires an area which is decided from limitations in the technology of semiconductor processing. The aforecited minimization of the gate width signifies that an IGFET whose drain current and drain breakdown voltage are high can be fabricated on a semiconductor chip of small area. Accordingly, the characteristics illustrated at A through F in FIG. 4 are of considerable importance.

In those portions of the equi-drain breakdown voltage characteristics shown in FIG. 4 which have steep inclines, the allowable drain current of the unit gate width varies greatly even when the offset gate length $L_{Reff}$ fluctuates to some extent due to the manufacturing technique. It is therefore undesirable to select the offset gate length within these portions. It is also undesirable to lengthen the offset gate $L_{Reff}$ because the width required for the element increases. Under such considerations, it is necessary from the economical viewpoint of fabrication yield etc. that the allowable drain current of the LGFET fall within a range of from the maximum allowable drain current value $(I_{DUmax})$ in FIG. 4 to 90% thereof $(I_{DUmax} \times 0.9)$. Accordingly, the offset gate length of the IGFET as shown in FIG. 1 needs to be selected within a range of from to 1 to 13 μm for the drain breakdown voltage of 100 V, 3 to 14 μm for 150 V, 6 to 18 μm for 200 V, 12 to 23 μm for 250 V, and 19 to 25 μm for 300 V. For any intermediate voltage other than the voltages mentioned above, the range of offset gate lengths permissible between the adjacent voltages may be proportionally allotted to the intermediate voltage.

Figure 5:
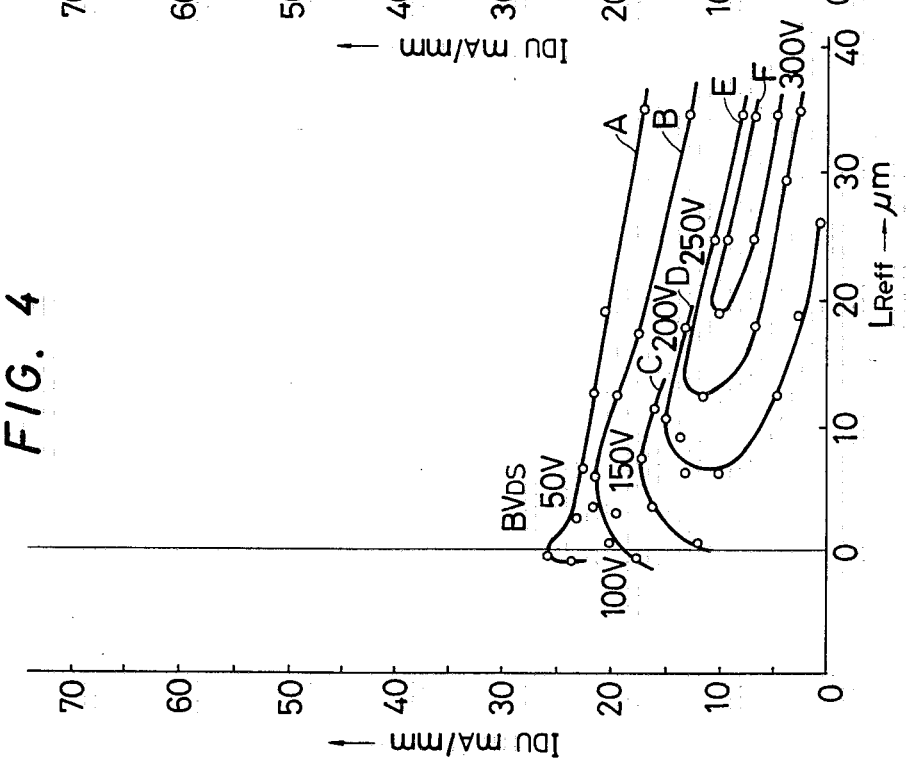

FIG. 5 shows characteristics similar to those in FIG. 4 as were obtained on an N-channel IGFET (not shown) which had the conductivity type opposite to that of the P-channel IGFET in FIG. 1 and in which the resistivity of a substrate, the impurity concentration of regions 2, 3 and 5, and the dimensions such as the thickness of a gate oxide film were made the same as those of the IGFET in FIG. 1. It has been revealed that, in case of the N-channel IGFET, the maximum value of the allowable drain current per unit gate width becomes approximately 2.4 times as large as that of the P-channel IGFET.

As apparent from FIG. 5, in the case of the N-channel IGFET, the optimum offset gate length needs to be selected under the same considerations as for the P-channel IGFET to a range of from 2 to 11 μm for the drain breakdown voltage of 100 V, 4 to 15 μm for 150 V, 7 to 14 μm for 200 V, 10 to 16 μm for 250 V, and 17 to 26 μm for 280 V.

Figure 2:
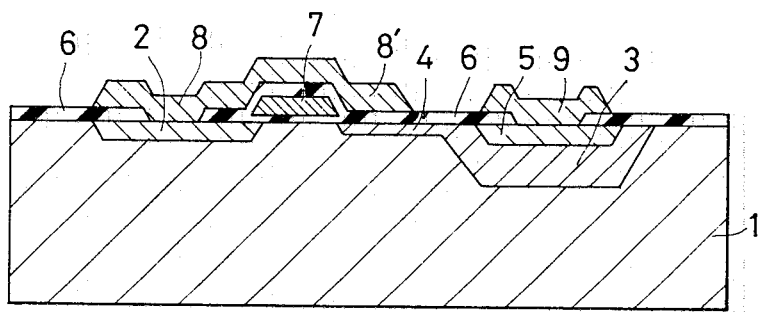

Various experiments were conducted on IGFET's similar to the IGFET of FIG. 1. As a result, it has been noticed that when a source electrode 8 is extended over a high resistivity region 4 as shown in FIG. 2, the drain breakdown voltage characteristic which depends on the implantation quantity of impurity ions for forming the high resistivity region 4 changes. A curve B in FIG. 6 illustrates the relationship between the quantity of impurity ion implantation $N_{DS}$ and the drain breakdown voltage $BV_{DS}$ on the IGFET of the structure in FIG. 2. In case of the IGFET in the FIG. 2, as apparent from the curves B and C in FIG. 6, the drain breakdown voltage curve moves in the direction in which the allowable drain current increases. Owing to the movement of the drain breakdown voltage curve, the characteristic curves A through F in FIG. 4 moved as a whole, though not shown, in the direction in which the allowable drain current increases by 30% to 50% in dependence on the position of a source electrode edge. The characteristic curves in FIG. 5 for the N-channel IGFET moved in similar fashion. It has been consequently become apparent that the IGFET in FIG. 2 can control a high voltage and a high current even when it is formed on a semiconductor chip which is still smaller than that of the IGFET in FIG. 1. As will be described later with reference to FIGS. 22 and 24, the movement of the drain breakdown voltage characteristic curve is accounted for by an electric field moderating effect in portion 8' of the source electrode 8 in FIG. 2.

The characteristic of the drain current versus the drain-source voltage of the IGFET in FIG. 1 or FIG. 2 exhibits the so-called negative resistance characteristic in which, when the breakdown voltage is exceeded, the drain-source breakdown voltage decreases and the drain current increases. Although the negative resistance was also noted in an IGFET for a low voltage and low current, it did not occur that the IGFET was destroyed by the negative resistance. In contrast, in an IGFET especially for a high breakdown voltage, once it had fallen into the negative resistance region, a high current flowed on account of a high voltage applied thereto, so that the IGFET was destroyed.

Figure 7:
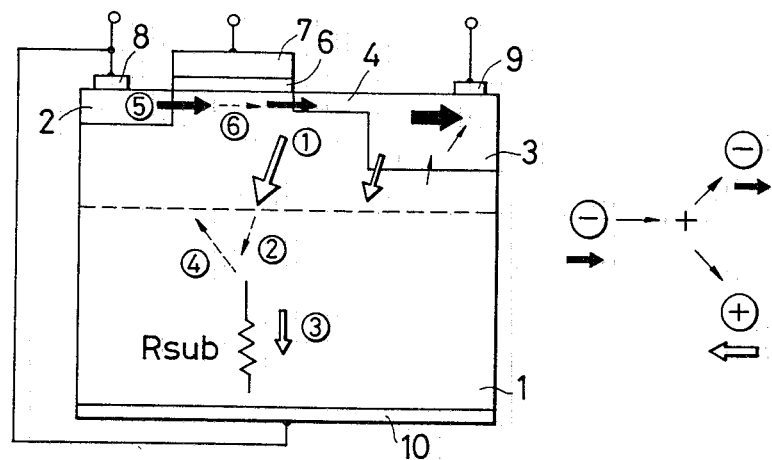
FIGS. 7 and 8 are sectional model diagrams of elements for explaining the operating mechanisms of the semiconductor devices.
Figure 9:
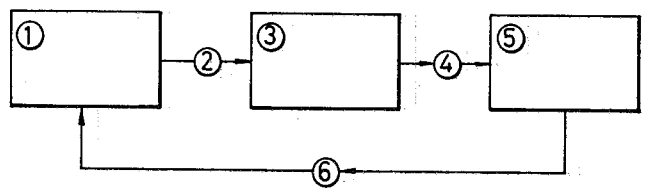
FIG. 9 is a simulative block diagram for explaining the destruction mechanism of the element.

The negative resistance phenomenon is elucidated as stated below. When the N-channel IGFET is taken as an example, a parasitic bipolar lateral N-P-N transistor is constructed which, as shown in FIG. 7, consists of the source region 2, the substrate 1 and the drain regions 3 and 4. When the avalanche multiplication arises in the high resistivity region 4 close to a gate electrode 7, 1 a hole current produced flows to 2 the substrate 1 and generates 3 a voltage across a resistance $R_{sub}$ existent in the substrate 1. Therefore, the potential of the substrate 1 becomes higher than that of the source region 2, and the injection of electrons 5 from the source region 2 to the substrate 1 takes place. When the injected electrons give rise to the avalanche multiplication again in a high electric field in the vicinity of the gate electrode 7, 1 to 6 illustrated in FIG. 7 constitute a positive feedback loop as shown by the blocks in FIG. 9. In consequence, the negative resistance is induced.

In the P-channel IGFET, the carrier which is injected from the source region 2 to the substrate 1 is a hole whose ionization rate is smaller than that of an electron, and hence, the positive feedback loop develops only with difficulty. The negative resistance is accordingly less prone to occur in the P-channel IGFET than in the N-channel IGFET.

One expedient for restraining the generation of the negative resistance is to enfeeble the electric field so as to prevent the occurrence of the avalanche multiplication ascribable to the carriers injected from the source.

Figure 8:
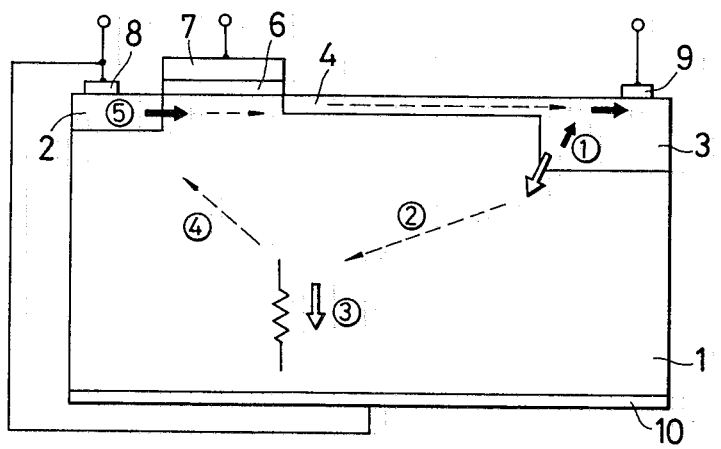

FIG. 8 is a model diagram in the case where the high resistivity region 4 is made long in order to lower the field strength along the semiconductor surface. In this case, the field strength in the vicinity of the gate electrode 7 becomes low, so that the avalanche multiplication in this portion does not occur. As a result, it is difficult for the negative resistance to occur.

Figure 10:
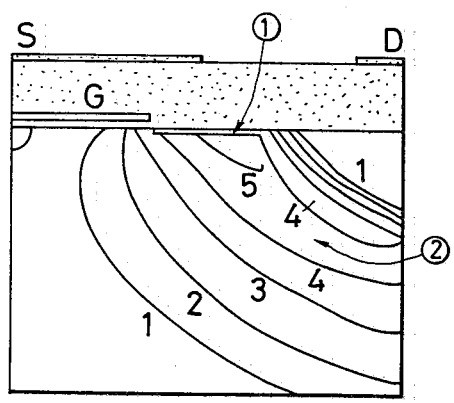
FIGS. 10 and 11 are sectional model diagrams of the elements for explaining the electric field strength distributions inside the semiconductor elements.
Figure 11:
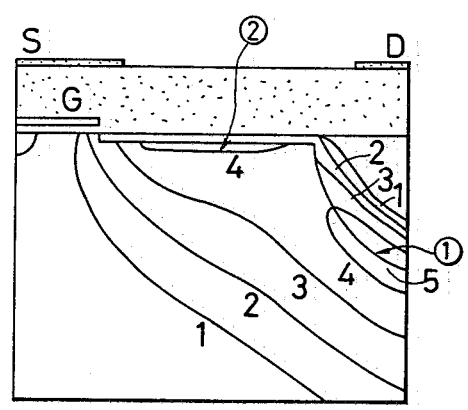

FIGS. 10 and 11 illustrate the analytical results of field strength distributions within the semiconductor in the IGFET of FIG. 2 as put into model form. In the figures, numerals 1 through 5 indicate equipotential lines. Symbol 1 indicates a place in which the field strength is the highest, and symbol 2 a place in which the field strength is the second highest. FIG. 10 corresponds to the case where the high resistivity region is short, while FIG. 11 corresponds to the case where it is long. As understood by comparing FIG. 10 and FIG. 11, in the case of the short high-resistivity region, the field strength in the vicinity of the surface is high, whereas in the case of the long high-resistivity region, the surface field is moderated and the electric field in the interior of the semiconductor is intense.

Figure 3:
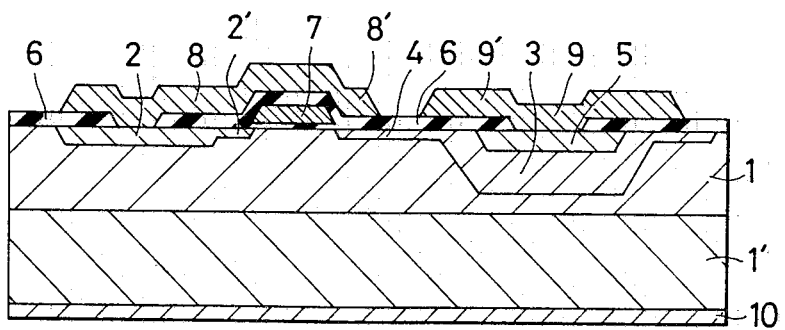

FIG. 3 shows an example in which a drain electrode 9 extends over a high resistivity region 4 beyond a drain intermediate region of comparatively low resistivity region 3 through an oxide film 6. In this example, the field crowding in the surface of the drain intermediate region 3 is moderated by an extension portion 9' of the drain electrode 9. Accordingly, the field crowding does not occur at the joint portion between the drain intermediate region and the high resistivity region. As a result, the drain breakdown voltage is determined by the P-N junction between the drain region 3 and a substrate 1 and is independent of the field crowding in the semiconductor surface. In this manner, the avalanche multiplication takes place in the interior of the semiconductor, and hence, the carriers injected from the source become unrelated to the avalanche multiplication.

Since the IGFET in FIG. 3 employs a silicon substrate in which the high resistivity region 1 is provided on a low resistivity substrate 1', the substrate resistance between a substrate electrode 10 and the drain region is made low, and the rise in the substrate potential due to a current flowing through the substrate can be suppressed to a small value. As a result, it is difficult to formed bias the P-N junction between the source region 2 and the substrate 1. In a case where a region 2' which is formed simultaneously with the high resistivity region 4 is adopted as a part of the source region as illustrated in FIG. 3, the manufacturing process is simplified. In addition, even when a gate electrode 7 is short, the IGFET can be fabricated at good yield.

FIGS. 12 through 15 show plan views and an expansion plan view for explaining an IGFET for high breakdown voltage and high current.

Figure 12:
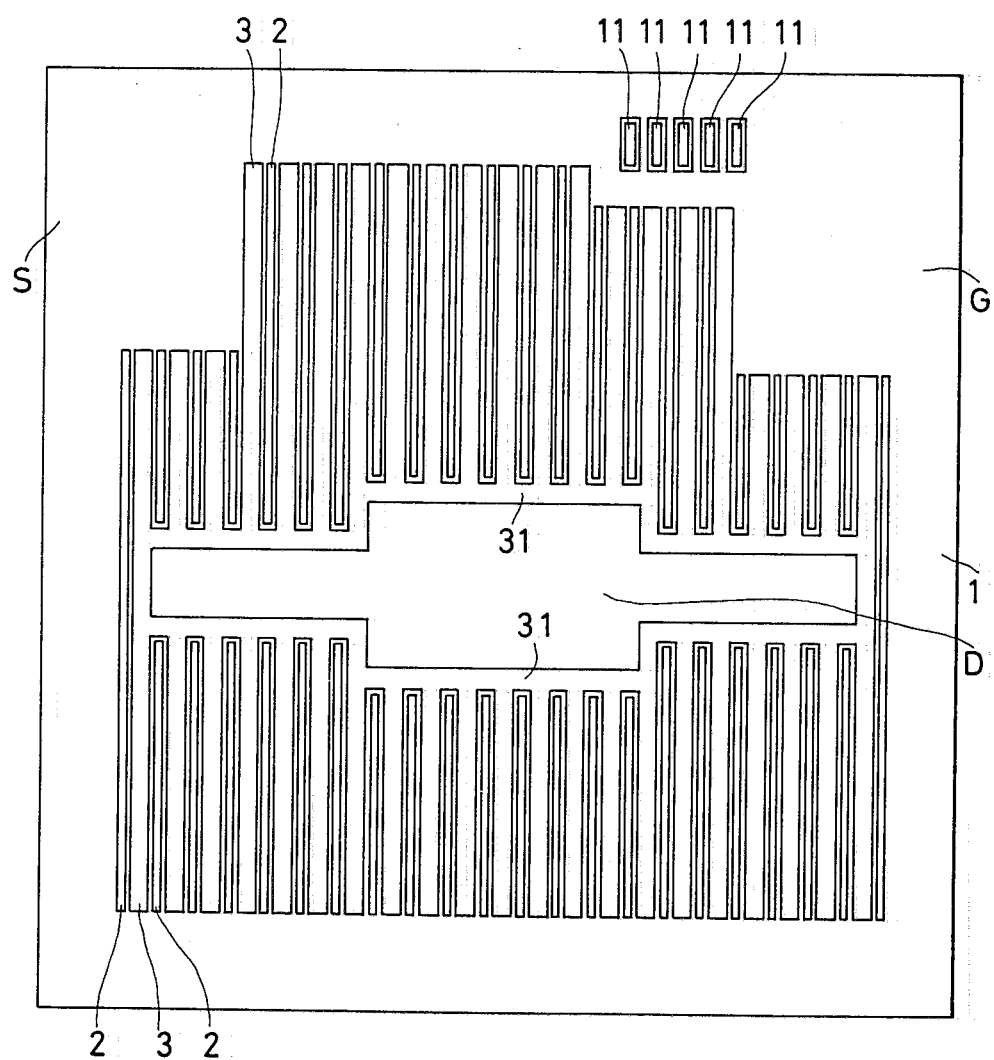
FIGS. 12 to 14 are plan views for respective manufacturing steps, of a semiconductor device according to an embodiment of this invention.

FIG. 12 shows the pattern of P-type source regions 2, P-type drain regions 3 and protective diode regions 11 which are formed in an N-type silicon substrate 1. Except regions S, D and G for source, drain and gate the source regions 2 and the drain regions 3, which are alternately arranged in the form of stripes. Owing to the fact that the source regions and the drain regions are stripe-shaped as shown, IGFET's of large gate width can be produced on a small semiconductor substate 1.

Whereas the individual source regions 2 are independent, the drain regions 3 are made common at one end by a drain region 31.

Figure 13:
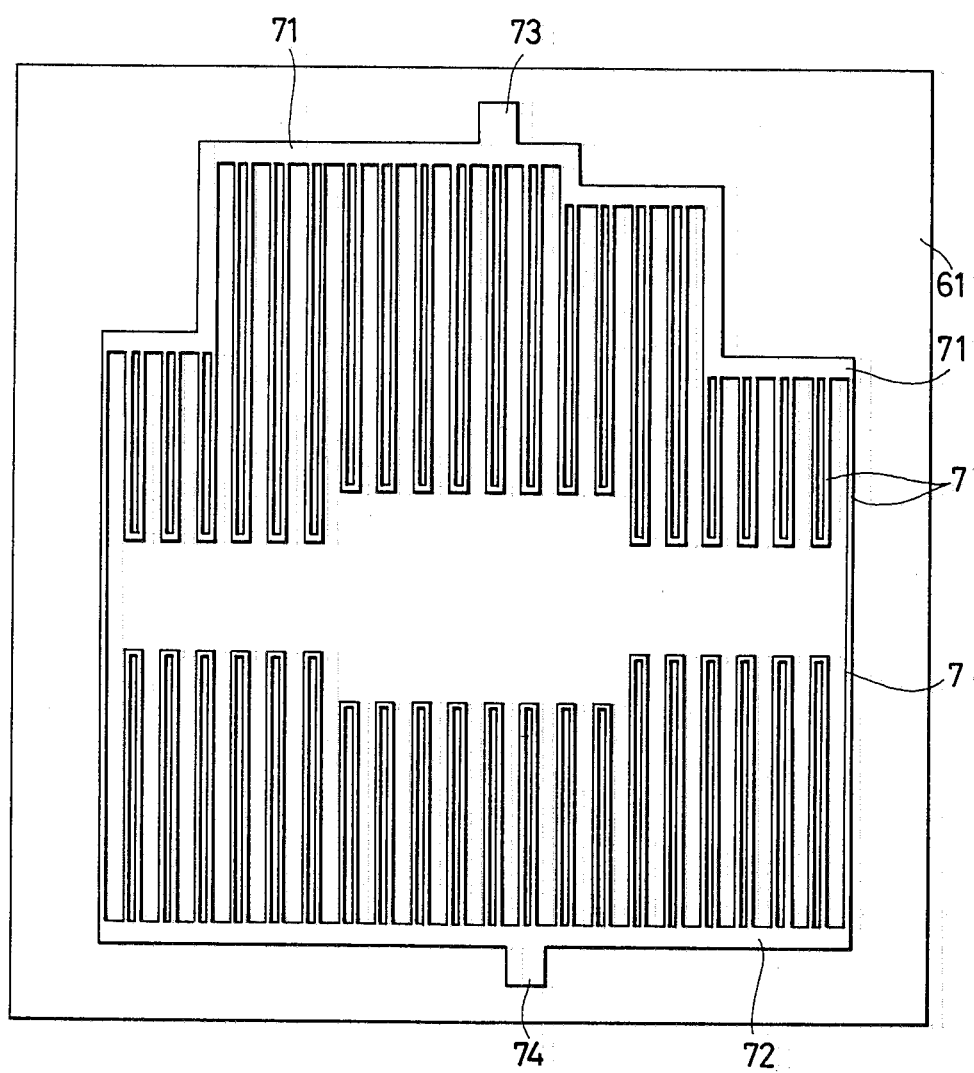

FIG. 13 shows the pattern of gate electrodes 7 which are made of polycrystalline silicon. The polycrystalline layer is arranged on a silicon oxide film 61. The pattern of the gate electrodes 7 is such that they cover those parts of the surface of the silicon substrate which lie between the source regions 2 and the drain regions 3 in FIG. 12. One end of each gate electrode is connected to a gate bus line 71 or 72 which is made of polycrystalline silicon. The gate bus lines 71 and 72 are respectively connected to electrode lead-out portions 73 and 74 which are made of polycrystalline silicon.

Figure 14:
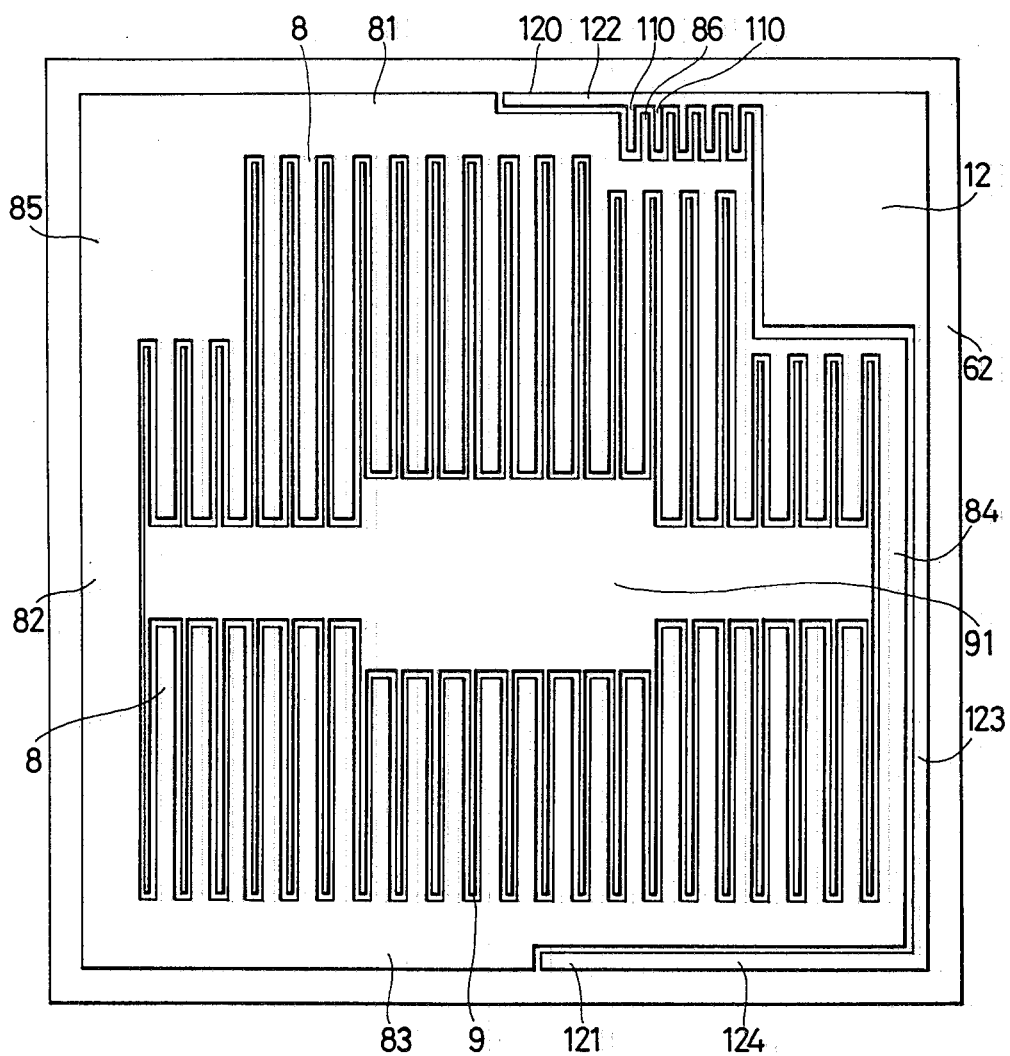

FIG. 14 shows the pattern of source electrodes, drain electrodes and gate electrodes which are formed on a silicon oxide film 62. These electrodes are made of aluminum. The source electrodes consist of a plurality of portions 8 which contact the source regions at portions of openings (not shown) in the silicon oxide film 62, source bus line portions 81 to 84 which connect the portions 8 with one another, and a source bonding pad portion 85. The drain electrodes consist of portions 9 which contact the drain regions at parts of openings (not shown) in the silicon oxide film 62, and a bonding pad portion 91 which connects these portions 9 in common. The gate electrodes consist of gate bus lines 122 and 124 which have portions 120 and 121 lying in contact with the polycrystalline silicon, respectively, a gate bus line 123, and a gate bonding pad portion 12.

Figure 15:
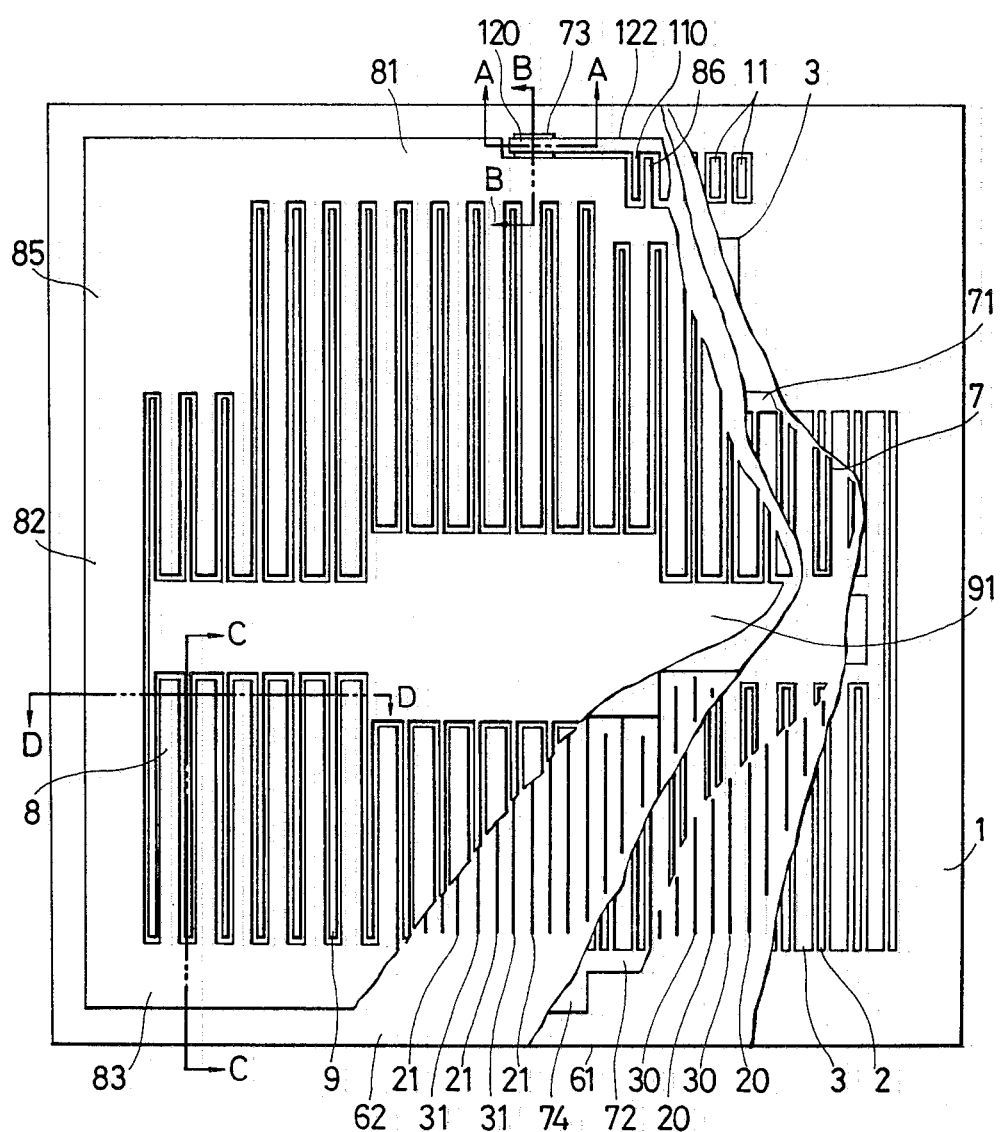
FIG. 15 is an expanded plan view of the semiconductor device of the embodiment.

FIG. 15 is an expanded plan view showing the state in which the polycrystalline silicon layer and the aluminum interconnection layer are stacked on the P-type silicon substrate 1. As previously stated, the source electrode 8 lies in resistance contact with the source region 2 at the portion of opening 20 in the silicon oxide film 61 and the opening 21 in the silicon oxide film 62. The drain electrode 9 lies in resistance contact with the drain region 3 at the portion of opening 30 in the silicon oxide film 61 and the opening 31 in the silicon oxide film 62.

In the IGFET's shown in FIG. 15, the drain electrodes which attain a high potential with respect to the silicon substrate 1 are arranged at the central portion of the silicon substrate in a manner to be surrounded by the source electrodes. Even when undesirable ions etc. attempt to migrate from the peripheral part of the silicon substrate 1, they are hindered by the source electrodes which scarcely differ in potential from the substrate in using of the device. As the result, the silicon surface is little affected by the undesirable ions and exhibits a comparatively high stability.

Figure 18:
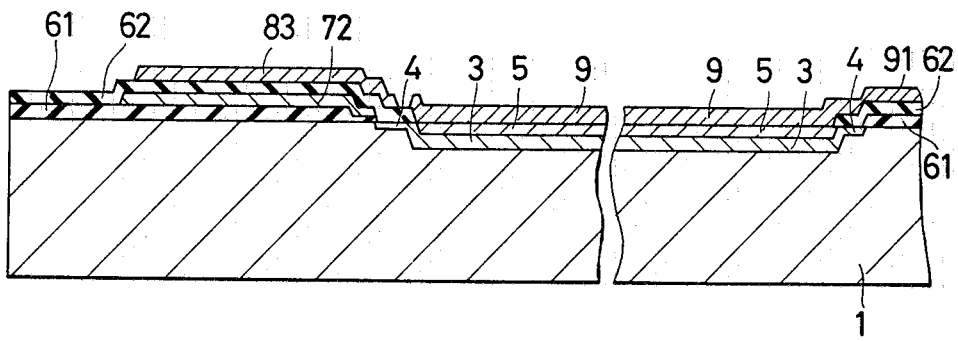
Figure 19:
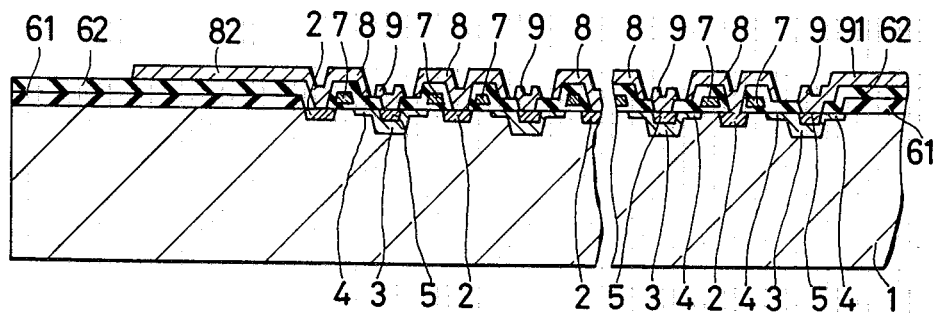

FIG. 18 shows a section of the IGFET's of FIG. 15 as viewed along line C—C in FIG. 15, while FIG. 19 shows a section viewed along line D—D in FIG. 15.

Referring to FIGS. 18 and 19, the drain region consists, as in the foregoing devices in FIGS. 1 to 3, of a P-type region 5 of high impurity concentration which contacts the drain electrode, the P-type drain intermediate region 3 of medium impurity concentration which surrounds the high concentration P-type region 5, and a P-type offset gate region 4 of low impurity concentration. The electrode 91 for the drain bonding pad which connects the drain electrodes in common is arranged on the silicon oxide film 61, and no drain region underlies the electrode 91. In order to increase the allowable drain current, the gate width must be made large as stated before. In this case, the source regions and drain regions in FIG. 15 can be extended and disposed under the electrode 91 for the drain bonding pad. It is to be noted, however, that the drain breakdown voltage decreases when the device is so constructed that an electrode connected to the drain or an electrode of a potential substantially equal to that of the drain crosses over the gate electrode and the active regions.

In order to facilitate understanding of the lowering of the breakdown voltage, an IGFET which is shown in a partial plan view of FIG. 45 and a sectional view of FIG. 46 taken along line A—A in FIG. 45 will be described in comparison with the IGFET which is shown in FIG. 15. In the IGFET's illustrated in FIGS. 45 and 46, drain regions 3 and source regions 2 are alternately arranged in the longitudinal direction and lateral direction as in a checkered flag, and gate electrodes 7 cover the surface of a silicon substrate 1 between the source regions 2 and the drain regions 3 through gate oxide films. A plurality of source electrodes 8 and a plurality of drain electrodes 9 extend on an oxide film 6 alternately and in parallel, and lie in contact with the source regions 2 and the drain regions 3 at portions of contact holes 10 and 11 provided in the oxide film 6, respectively. Since, in FIGS. 45 and 46, the gate electrodes 7 have a mesh-type configuration, the IGFET is referred to as a "lateral mesh type IGFET." On the hand, the gate electrodes are stripe-shaped in FIGS. 12 to 15, and hence, the IGFET is termed a "lateral strip type IGFET."

Figure 20:
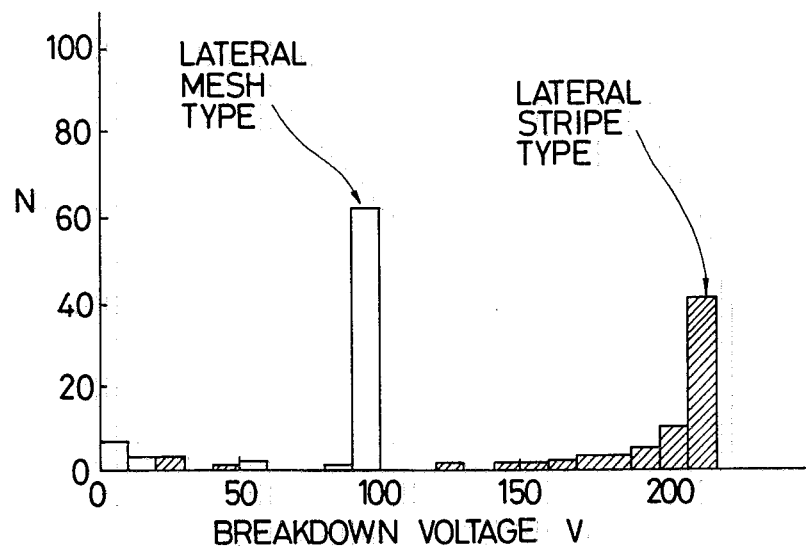
FIG. 20 is a diagram of breakdown voltage distributions for explaining a feature of a semiconductor device according to an embodiment of this invention.

FIG. 20 shows the distributions of the drain-source breakdown voltages of the lateral mesh type IGFET and the lateral stripe type IGFET which are simultaneously formed on an identical silicon substrate and which have source regions and drain regions of the same impurity concentration, and the same gate width and offset gate length. It is seen from the figure that the lateral mesh type IGFET has breakdown voltages which are only approximately ½ of those of the lateral stripe type IGFET. The difference in the characteristics of the two types of transistors is elucidated as described below.

Figure 45:
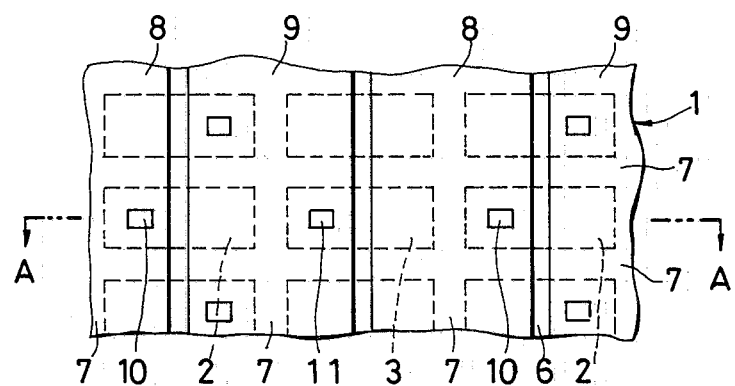
FIG. 45 is a plan view of the essential portions of a semiconductor device for explaining a feature of this invention.
Figure 46:
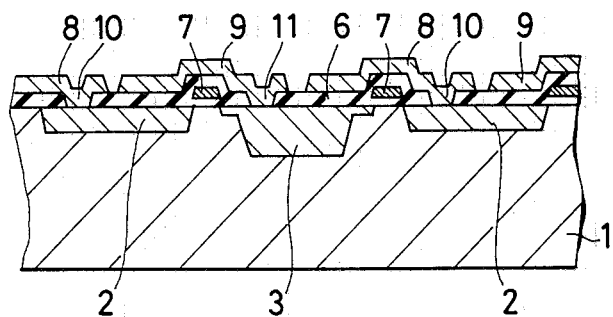
FIG. 46 is a sectional view of the essential portions as taken along line A—A in FIG. 45.

In the lateral mesh type IGFET, as apparent from FIGS. 45 and 46, the drain electrode 9 has a portion which extends over the gate electrode 7. On the other hand, in the lateral stripe type IGFET, as apparent from FIGS. 12 to 15, the source electrode 8 extends over the high resistivity region or offset gate region beyond the gate electrode 7.

Figure 21:
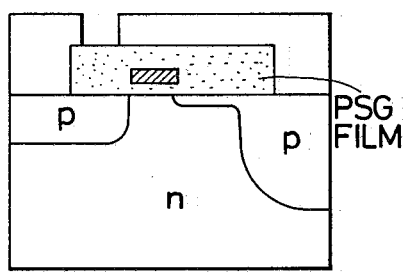
FIGS. 21 and 22 are sectional views of the essential portions of semiconductor devices.
Figure 22:
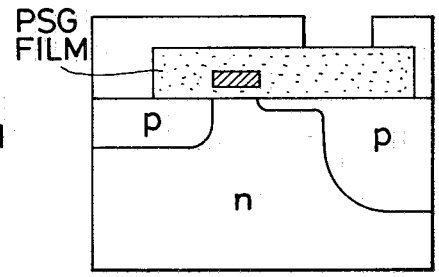
Figure 23:
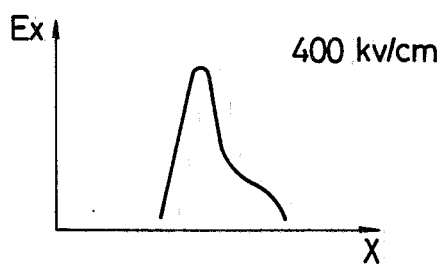
FIGS. 23 and 24 are diagrams of the field strength curves of the semiconductor surfaces of the devices corresponding to FIGS. 21 and 22, respectively.
Figure 24:
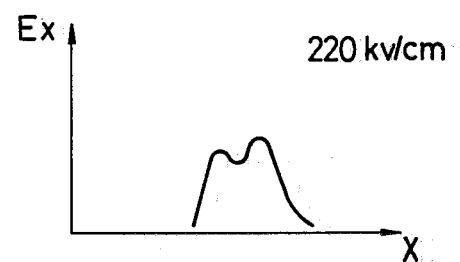

Electric field strengths along the surfaces of semiconductor substrates were analyzed on IGFET's in FIG. 21 and FIG. 22 in which the arrangements of the source electrodes and the drain electrodes were different, and the analytical results are illustrated in FIG. 23 and FIG. 24, respectively. As to the IGFET of FIG. 21 in which the drain electrode extends over the gate electrode, it has been found from the field strength curve in FIG. 23 that the peak of the field strength appears in the vicinity of a gate electrode edge on the side of the offset gate region and that, by way of example, the field strength becomes as high as 400 KV/cm at an applied voltage of 100 V. This is a value of the same degree as the break-over critical field of silicon, 300 to 500 KV/cm. In contrast, as regards the IGFET of FIG. 22 in which the source electrode extends over the offset gate region, it is known from FIG. 24 that the field strength along the semiconductor surface becomes only about 220 KV/cm at the applied voltage of 100 V.

Accordingly, in the case where, as stated before, the source, drain and gate regions extend under the electrode for the drain bonding pad 91 in order to increase the allowable drain current, the drain breakdown voltage of the extension portion decreases due to the field effect of the electrode 91. Since the lowering of the breakdown voltage of a portion of the drain region determines the breakdown voltage of the IGFET to be completed, the IGFET provided with the extension portion is not desirable when a high breakdown voltage is required.

Although it is possible to extend the drain region to the surface of the silicon substrate 1 underlying the electrode for the drain bonding pad 91, the drain junction capacitance increases. The construction in which no drain region is disposed under the electrode 91 as shown in FIGS. 18 and 19 prevents the lowering of the drain breakdown voltage and lowers the drain junction capacitance.

The IGFET's shown in FIGS. 12 to 15 and FIGS. 18 and 19 have the drain electrodes arranged at the central portion of the silicon substrate 1 and have the gate electrodes arranged around them. According to this arrangement, extension of the drain electrode over the gate electrode or over the active region proximate to the gate electrode can be avoided. Therefore, the undesirable field plate effect attributed to the drain electrode can be eliminated. The lateral stripe type IGFET illustrated in FIG. 12 etc. is more advantageous than the lateral mesh type IGFET in terms of the breakdown voltage characteristic.

As described previously with reference to FIG. 13, the plurality of gate electrodes 7 are respectively connected to the two bus lines 71 and 72 at upper and lower parts as viewed in the plane of the silicon substrate. In a case where the gate electrodes are made of silicon as shown, they exhibit a somewhat higher gate resistance than ones of a metal such as aluminum. Owing to the adoption of the gate bus lines, however, it is possible to avoid the gate electrode being made up of only one piece corresponding to the gate width. The gate electrode can be split into a plurality of parts as shown by adopting the gate bus lines, with the result that the gate resistance can be made substantially negligible with respect to a required characteristic.

The bus lines 71 and 72 made of polycrystalline silicon are connected in common by the bus lines 122, 123 and 124 made of aluminum. This construction is based on the fact that aluminum exhibits a resistance value remarkably lower than that of polycrystalline silicon, so that a bus line of aluminum can be made narrower than a bus line of silicon. Thus, it is advantageous in that the area of the silicon substrate can be made smaller than in a case where bus lines are formed only of silicon, the bus lines are arranged at the whole periphery of the major surface of a silicon substrate and an aluminum electrode is contacted with the silicon bus lines, and in that the opposing areas between the aluminum and silicon bus lines and the silicon substrate can be reduced, thereby enabling the gate input capacitance to be reduced.

Figure 16:
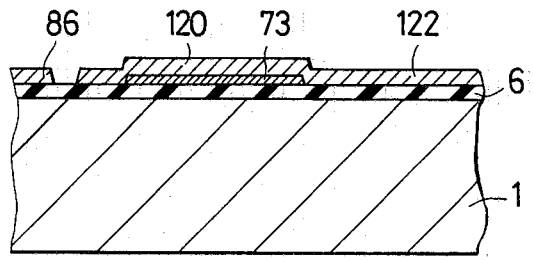
FIGS. 16 to 19 are sectional views of the essential portions of the semiconductor device shown in FIG. 15, and are respectively taken along lines A—A, B—B, C—C and D—D in FIG. 15.
Figure 17:
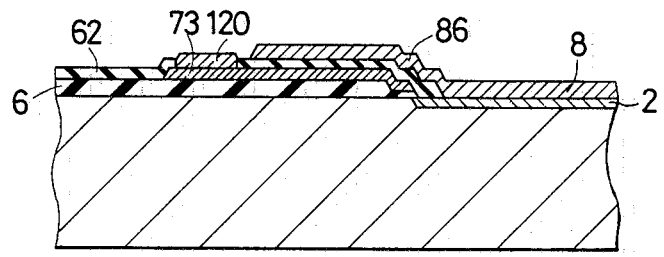

For a better understanding of the connection between the electrode lead-out portion of polycrystalline silicon 73 and the gate bus line of aluminum 122 in FIG. 15, a section viewed along line A—A and a section viewed along line B—B in the figure are illustrated in FIG. 16 and FIG. 17, respectively. Polycrystalline silicon gate technology is used to arrange the gate electrode 7 and the source electrode 8 on the oxide films constituting respectively different layers, and the gate bus lines 71, 72, the gate electrode lead-out portions 73, 74 and the aluminum source bus lines 81, 82 are also arranged on respectively different layers. Owing to this construction, the aluminum gate bus line 122 is connected at the peripheral portion of the surface of the silicon substrate to the polycrystalline silicon gate electrode lead-out portion 73 which traverses an area below the source bus line 81.

Owing to the fact that the aluminum gate bus lines 122, 123 and 124 are arranged at the peripheral portion of the silicon substrate surface, absolutely no electrode such as a source electrode is arranged outside the gate bonding pad electrode which is connected to the bus lines. As will be explained later, this construction prevents the short-circuit between electrodes due to a connector in a case where the connector is connected to the bonding pad.

The above construction in which the aluminum gate bus lines are disposed outside the source bus lines by the socalled cross interconnection technique does not obstruct the source electrodes and the source bus lines from extending towards the central portion of the surface of the silicon substrate. Owing to the elimination of this limitation, as understood from FIGS. 15, 18 and 19, it becomes possible to arrange the source electrodes 8 and the source bus lines 81 through 84 over the high resistivity regions 4 which are disposed along the entire peripheries of the drain regions 3 of medium impurity concentration. Owing to this arrangement, the desirable field plate effect acts by virtue of the source electrodes and the source bus lines as described with reference to FIGS. 22 and 24, so that the IGFET's in FIG. 15 achieve a high drain breakdown voltage.

Figure 25:
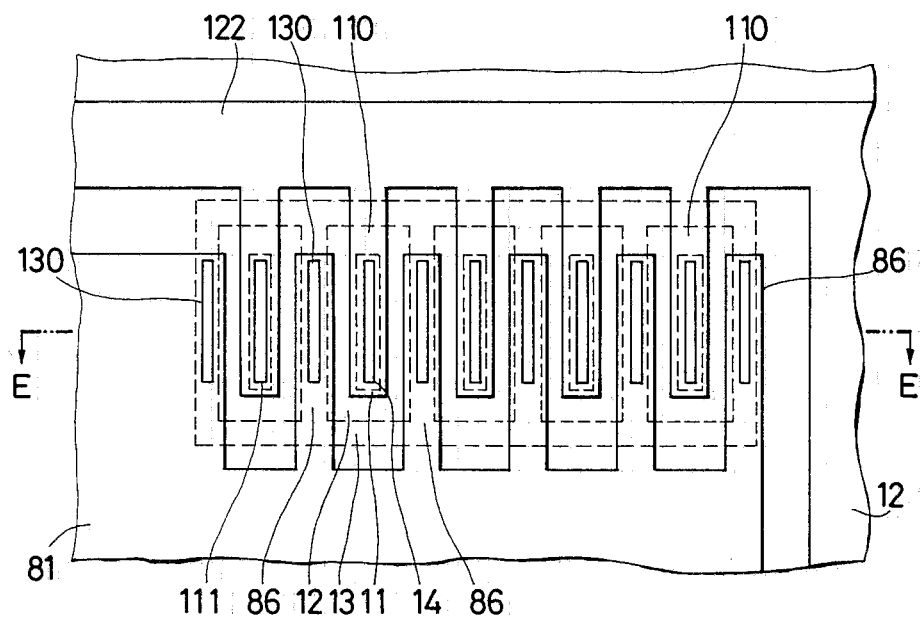
FIG. 25 is a plan view of the essential portions of a semiconductor device for explaining another aspect of performance of this invention.
Figure 26:
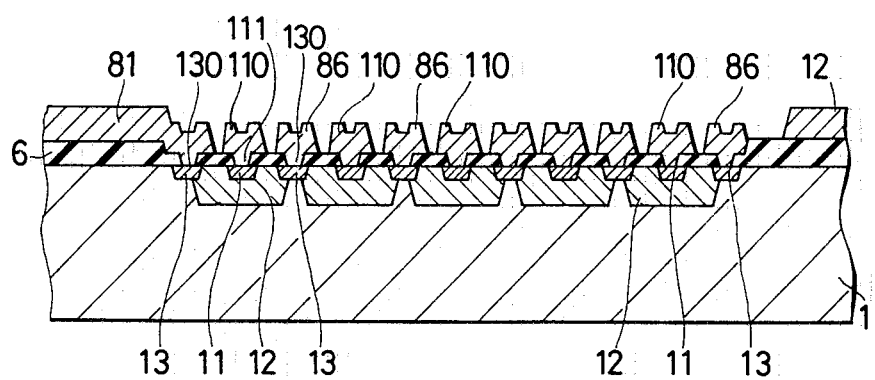
FIG. 26 is a sectional view of the device in FIG. 25 as taken along line E—E.

Concerning the protective diodes in FIG. 15, an enlarged plan view is shown in FIG. 25, and a sectional view taken along E—E in FIG. 25 is shown in FIG. 26.

The protective diodes are constructed of a plurality of P-type regions 12 which are formed in an N-type silicon substrate 1, a grid-like N-type region of high impurity concentration 13 which is formed in a manner to extend to both the peripheral surfaces of the P-type regions and the major surface of the silicon substrate 1, and N-type regions of high impurity concentration 11 which are disposed in the surfaces of the respective P-type regions 12 at a predetermined distance from the N-type region 13. Aluminum electrodes 110 which are connected to the gate bus line 122 lie in resistance contact with the respective P-type regions 12 at portions of openings 111 provided in the oxide film 6, while aluminum electrodes 86 which are connected to the source bus line 81 lie in resistance contact with the grid-like N-type region 13 at portions of openings 130 provided in the oxide film 6.

The protective diode is composed of substantially two diodes which are made up of the P-N junction between the N-type region 13 and the P-type region 12 and the P-N junction between the P-type region 12 and the N-type region 11 and which are series connected in mutually opposite directions.

Since the protective diode is connected between the gate electrode and the source electrode as described above, an abnormally high positive or negative voltage which is impressed on the gate electrode is limited by the break-over voltage of either of the P-N junctions. As a result, the application of any abnormal voltage on a very thin gate insulating film, thereby to destruction of the gate insulating film, is prevented.

In order to sufficiently protect the gate insulating film from the high voltage, the allowable diode current needs to be enlarged at the time of the break-over. Owing to the high allowable diode current, the destruction of the protective diode itself can be prevented. Since, in the protective diode, the break-over of the P-N junction takes place in the vicinity of the silicon surface, the current capacity is proportional to the effective peripheral length of the P-N junction. The construction shown in FIGS. 25 and 26, wherein the unit protective diodes, in which the N-type region 11 having a substantially rectilinear plan pattern is surrounded by the P-type region 12 and the N-type region 13 are connected in parallel, can realize a great effective peripheral length in a small area. Since, as stated above, the protective diodes in FIGS. 25 and 26 are so constructed that the unit protective diodes are substantially independent, the geometries and impurity profiles of the unit protective diodes can be made uniform, and the break-over characteristics can also be made uniform. Thus, the device becomes immune to destruction due to an excess current. The protective diodes are an assemblage of the units. Therefore, when the allowable current is to be altered, the alteration can be simply accomplished by, for example, leaving predetermined unit diodes unwired.

Of course, if some unbalance is permitted, the plurality of P-type regions 12 may be formed as one continuous P-type region. Also in this case, the N-type region 13 is put into the grid-like plan pattern as before, whereby there is no decrease in the effective peripheral length of the P-N junction at the time of break-over.

Figure 47:
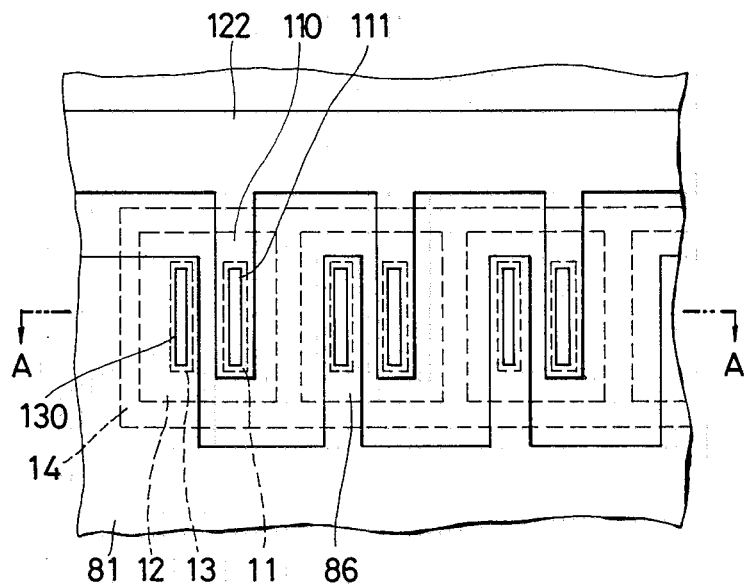
FIG. 47 is a plan view of the essential portions of a semiconductor device according to another embodiment of this invention.
Figure 48:
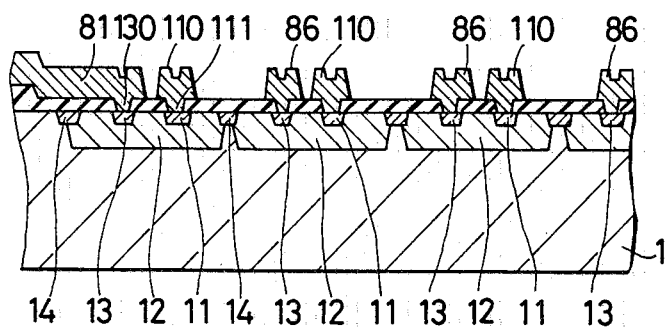
FIG. 48 is a sectional view of the essential portions of the semiconductor device as taken along line A—A in FIG. 47.

The protective diodes in FIGS. 25 and 26 can be modified. A plan view of a modified embodiment is shown in FIG. 47, and a sectional view taken along A—A in the figure is shown in FIG. 48. In the present protective diodes, the N-type regions 13 which are connected to the source bus line 81 are separated from the N-type silicon substrate 1 and are formed within the P-type regions 12. A grid-like N-type region 14 is formed at surface end parts of the P-type regions 12. In this embodiment, the source bus line 81 is not connected to the silicon substrate through the N-type regions. Accordingly, the source bus line is electrically in the floating state with respect to the silicon substrate. In the embodiment, the P-N junction between the N-type region 13 and the P-type region or the P-N junction between the N-type region 11 and the P-type region breaks over with respect to an abnormal voltage applied between the gate electrode and the source electrode. In contrast, the P-N junction between the N-type region 11 and the P-type region 12 or the P-N junction between the N-type region 14 and the P-type region 12 breaks over with respect to an abnormal voltage applied between the gate electrode and the silicon substrate. According to the embodiment, the N-type regions 11 and 13 are in a parallel arrangement and can be fashioned in the same shape. Therefore, the effective peripheral lengths of the N-type regions are equal, and these regions exhibit allowable currents of the same absolute value with respect to positive and negative abnormal voltages applied between the source and gate. Needless to say, the protective diodes shown in FIGS. 25 and 26 and FIGS. 47 and 48 serve, not only for the foregoing IGFET of the offset gate type, but also as protective means for gate inputs of the general IGFET's.

Figure 38:
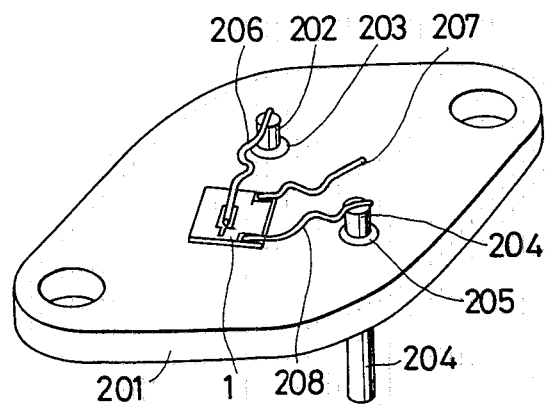
FIG. 38 is an assembly view of a semiconductor device.

The silicon substrate in FIG. 15 is attached to a heat sink. FIG. 38 shows a perspective view of the state in which the silicon substrate 1 formed with the IGFET's is mounted on a TO-3 type stem. Referring to the figure, the silicon substrate 1 is fixed to a metal header 201 by the well-known brazing technique. One end of an aluminum wire 206 is connected to the drain bonding pad electrode by the ultrasonic bonding technique. The other end of the aluminum wire 206 is connected by the same ultrasonic bonding technique to a flat head part of a lead wire 202 which is fixed to the header 201 with glass 203. The gate bonding pad electrode is connected to one end of an aluminum wire 208, the other end of which is connected to a flat head part of a lead wire 204 which is fixed to the header 201 with glass 205. In this embodiment, the header 201 is used as a source terminal for the IGFET's. In this case, as apparent from FIGS. 25 and 26, the source electrode is connected to the N-type silicon substrate 1 through the N-type region 13. Since, in this manner, the source electrode and the silicon substrate 1 are short-circuited on the silicon body, they can attain the same potential. In this embodiment, however, the source bonding pad electrode is connected to the header 201 owing to the fact that the silicon substrate has a resistance which cannot be ignored and the fact that a current permitted to flow from the regions for the protective diode to the silicon substrate is limited. That is, the source bonding pad electrode is connected to the header 201 by an aluminum wire 207. After connecting this aluminum wire, a metal cap (not shown) is fixed to the header 201. Then, the IGFET's are completed.

The IGFET in FIG. 15 is manufactured by the self-alignment technique relying on a silicon gate. Sections of the silicon substrate in various steps of manufacture are shown in FIGS. 27 to 34. The following description will be directed to the manufacture of a P-channel type IGFET.

Figure 27:
FIGS. 27 to 34 are sectional views of the essential portions of a semiconductor device in individual steps of manufacture and serve to explain a method of manufacturing the device according to this invention.

As illustrated in FIG. 27, an N-type silicon substrate 1 which has a resistivity of 5 Ωcm and a thickness of 300 μm and whose major surface is the (100) face is prepared. A silicon oxide film 6 having a thickness of 5,000 Å is formed on the surface of the silicon substrate by the well-known thermal oxidation process.

Figure 28:
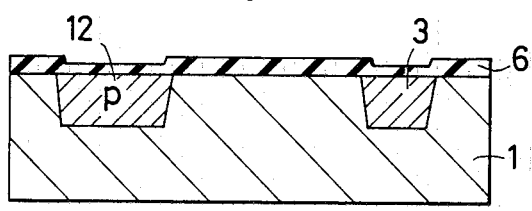

Subsequently, as illustrated in FIG. 28, openings are provided in the oxide film 6 by the photoetching technique so as to expose the surface of the silicon substrate, boron as a P-type impurity is ion-implanted into the exposed surface parts at an implantation energy of 100 KeV so as to establish an impurity concentration of $3 \times 10^{13}$ atoms/cm$^2$, and the boron is subjected to the stretching diffusion in an oxidizing atmosphere at 1,200° C., thereby to form P-type regions 12 and 3 having a thickness of 7.4 μm. These P-type regions are high resistivity regions in which the impurity is precisely stipulated by the ion implantation technique. Later, the P-type region 12 serves as a region for a protective diode, and the P-type region 3 serves as a drain intermediate region.

Figure 29:
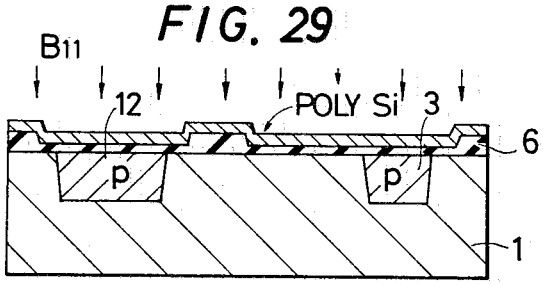

As illustrated in FIG. 29, those parts of the oxide film which overlie a portion to form the protective diode and portions to be made a source region, a drain region and a channel region are removed by the selective etching technique, and a thermal oxidation film having a thickness of 1,300 Å is formed on the exposed silicon surface by the thermal oxidation technique. Thereafter, a polycrystalline silicon layer having a thickness of 0.5 μm is formed by the chemical vapor deposition process employing monosilane. Subsequently, boron as an impurity is ion-implanted into the polycrystalline silicon layer under conditions of 30 KeV and $3 \times 10^{14}$ atoms/cm². The ion implantation of boron into the polycrystalline silicon layer is executed in order to compensate for the impurity quantity and the uniformity since no impurity is introduced into the entire area of the polycrystalline silicon layer in a sufficient amount of uniformly in the succeeding process of manufacture. Owing to the ion implantation, the polycrystalline silicon layer comes to have a resistance which is low enough to serve as a gate electrode and a gate bus line later. The polycrystalline silicon layer has boron introduced into the surface part over the entire area thereof more uniformly by the ion implantation technique than by any other doping technique. As a result no local change occurs in the threshold voltages of the IGFET's to be finished within the identical silicon substrate.

Figure 30:
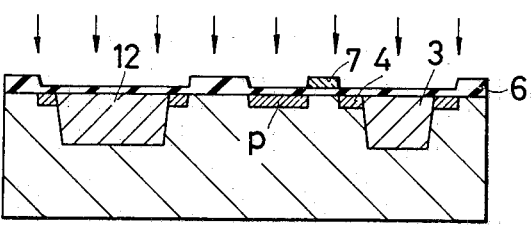

As illustrated in FIG. 30, the polycrystalline silicon layer except portions to become the gate electrode and the gate bus line is removed by selective etching, whereupon boron is ion-implanted into the surface with the polycrystalline silicon removed, under conditions of 80 KeV and $2.5 \times 10^{12}$ atoms/cm². At this time, the polycrystalline silicon layer and the thick oxide film serve as a mask in the ion implantation, so that P-type regions of low impurity concentration are formed in the surface of the silicon substrate as shown in the figure. The region 4 continuous to the drain intermediate region 3 as formed at this time is used as an offset gate region.

Figure 31:
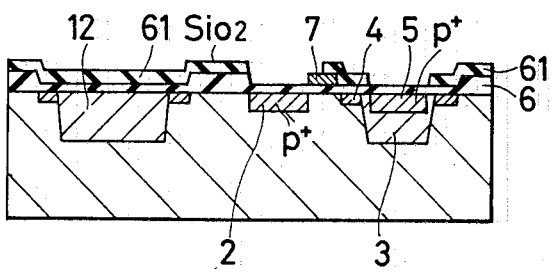

As illustrated in FIG. 31, a silicon oxide film 61 having a thickness of 0.3 μm is formed by thermodecomposition of tetraethoxysilane on the major surface of the silicon substrate including the surface of the polycrystalline silicon layer. The silicon oxide film 61 is used as a mask for impurity selective-diffusion for forming the source region and the highly doped drain region. The silicon oxide film is photoetched for this mask. In the photoetching, an opening of the oxide film 61 for the source is made so as to terminate on the gate electrode. Subsequently, boron is diffused at a temperature of, e.g., 1,100° C. to form the source region 2 and the highly doped drain region 5 which have a depth of 0.9 m and a sheet resistance of 15Ω/□. In this diffusion, the source region 2 is self-aligned with the gate polycrystalline silicon layer 7.

Figure 32:
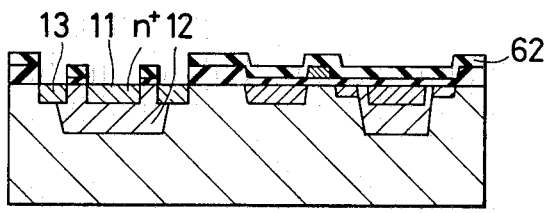

As illustrated in FIG. 32, a silicon oxide film 62 is formed on the surface of the silicon substrate to the same thickness as that of, and under the same manufacturing conditions as those of, the silicon oxide film 61 in FIG. 31. Subsequently, the silicon oxide film is photoetched, and phosphorus is diffused into the exposed parts of the silicon furface at a temperature of 1,100° C., to form N+ regions 11 and 13 which have a depth of 1.7 μm and a sheet resistance of 10/Ω□. The regions 11 and 13 are used as the regions for the protective diode.

Figure 33:
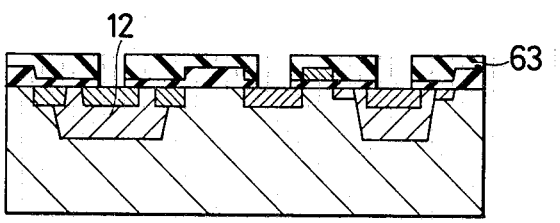

As illustrated in FIG. 33, a phospho-silicate glass (PSG) layer 63 having a thickness of 0.9 μm is formed. Subsequently, the PSG layer and the oxide film are selectively etched by the photoetching technique, to expose the source region, the drain region, a polycrystalline silicon electrode lead-out portion (not shown) and the diode region.

Figure 34:
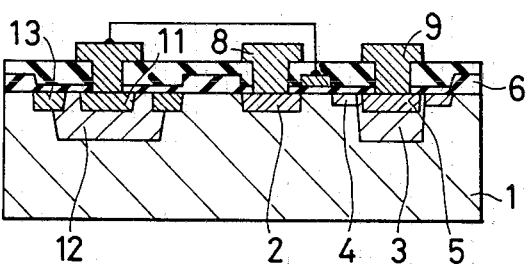

As illustrated in FIG. 34, aluminum is evaporated to a thickness of 4 μm and photoetched to form source, gate and drain electrodes.

Although not shown in the drawing, after forming aluminum electrodes, a silicon oxide film having a thickness of 1.2 μm is formed over the entire area of the major surface of the silicon substrate. Subsequently, the silicon oxide film is selectively photoetched so as to expose the aluminum for source, gate and drain bonding pads.

Figure 35:
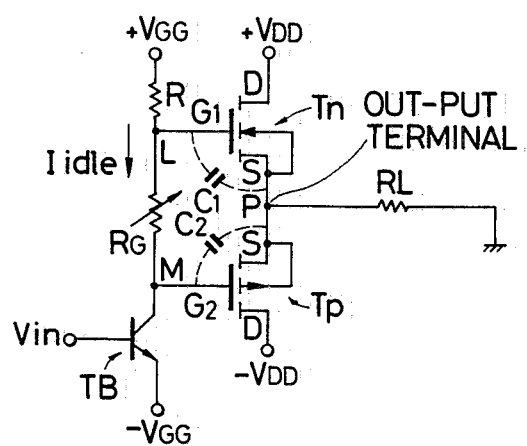
FIG. 35 is a diagram of an electronic appliance circuit to which a semiconductor device according to this invention is applied.

FIG. 35 shows a circuit arrangement of an audio amplifier output stage as an example of a circuit which is constructed by the use of complementary insulated-gate type FET's according to this invention. In the figure, a SEPP (Single Ended Push-Pull) system is adopted in which the internal resistance (4Ω or 8Ω) of a loudspeaker is connected to an output terminal of the output stage as a load resistance $R_L$. The source electrode S and P-type semiconductor substrate electrode (the so-called second gate electrode) of an enhancement type N-channel MOSFET $T_n$, and the source electrode S and N-type semiconductor substrate electrode (the so-called second gate electrode) of an enhancement type P-channel MOSFET $T_p$ are connected to the output terminal P in common. Power sources $+V_{DD}$ and $-V_{DD}$ are respectively connected to the drain electrodes of the MOSFET's $T_n$ and $T_p$. A bias voltage adjusting circuit which consists of a resistance R, a variable resistance $R_G$ (0–50Ω) and a bipolar transistor $T_B$ is connected to the respective gate electrodes $G_1$ and $G_2$. Power sources $+V_{GG}$ and $-V_{GG}$ whose voltage values are greater than the value $V_{DD}$ are respectively connected to one end of the resistance R and the emitter electrode of the transistor $T_B$. An input signal $V_{in}$ is applied to the base electrode of the transistor $T_B$. In such a circuit, the relationship between the rated output power of the amplifier and the maximum rated voltage of the power MOSFET is given by the following equation:

$$V_{max} = \pm (V_{DS(sat)} + \sqrt{2 P_O R_L})$$

where $V_{max}$, $P_O$ and $R_L$ denote the maximum voltage which is applied to the power MOSFET, the rated output power of the amplifier and the load resistance, respectively. $V_{DS(sat)}$ denotes the source-drain saturation voltage of the MOSFET at the time of the maximum current, and the ratio between the saturation voltage and the maximum current is defined as the "on" resistance. Letting $K_1$ and $K_2$ denote the supply voltage regulation (including the power source regulation) and the relative deviation of the turn ratio of a power transformer (not shown), respectively, the necessary breakdown voltages of the N- and P-channel MOSFET's are given by the following equation:

$$|BV_{DS}| \geq 2(V_{DS(sat)} + \sqrt{2 P_O R_L})\cdot(1+K_1)\cdot(1+K_2)$$

Figure 36:
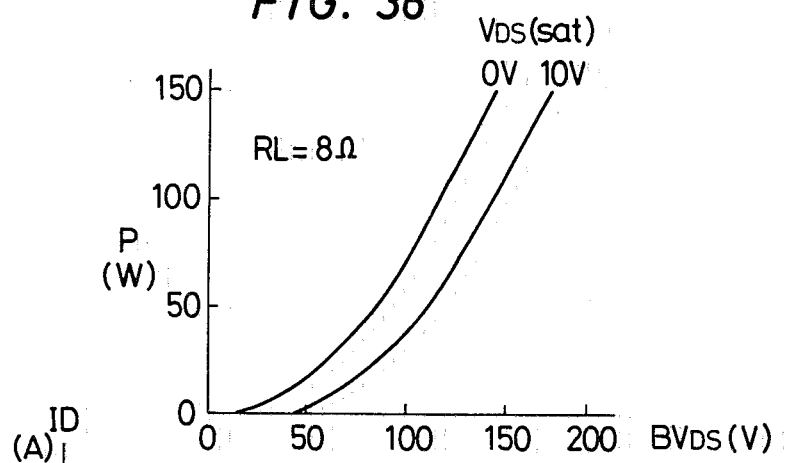
FIGS. 36, 37A and 37B are diagrams of electrical characteristics.

The relationship between the drain breakdown voltage $BV_{DS}$ and the output power P as calculated from the above equation on the assumption that $K_1$, $K_2 = 0.15$ to 0.2, is illustrated in FIG. 36. The relationship among the maximum current $I_{Dmax}$, the maximum rated output $P_O$ and the load resistance $R_L$ is represented by the following equation:

$$I_{Dmax} = \sqrt{\frac{2 P_O}{R_L}}$$

The gate-source breakdown voltages of the MOSFET's $T_n$ and $T_p$ are designed to be equal to or greater than the gate voltage which gives the maximum current, and the gate-drain breakdown voltages are designed to be at substantially the same degree as the source-drain breakdown voltages.

Figure 37A:
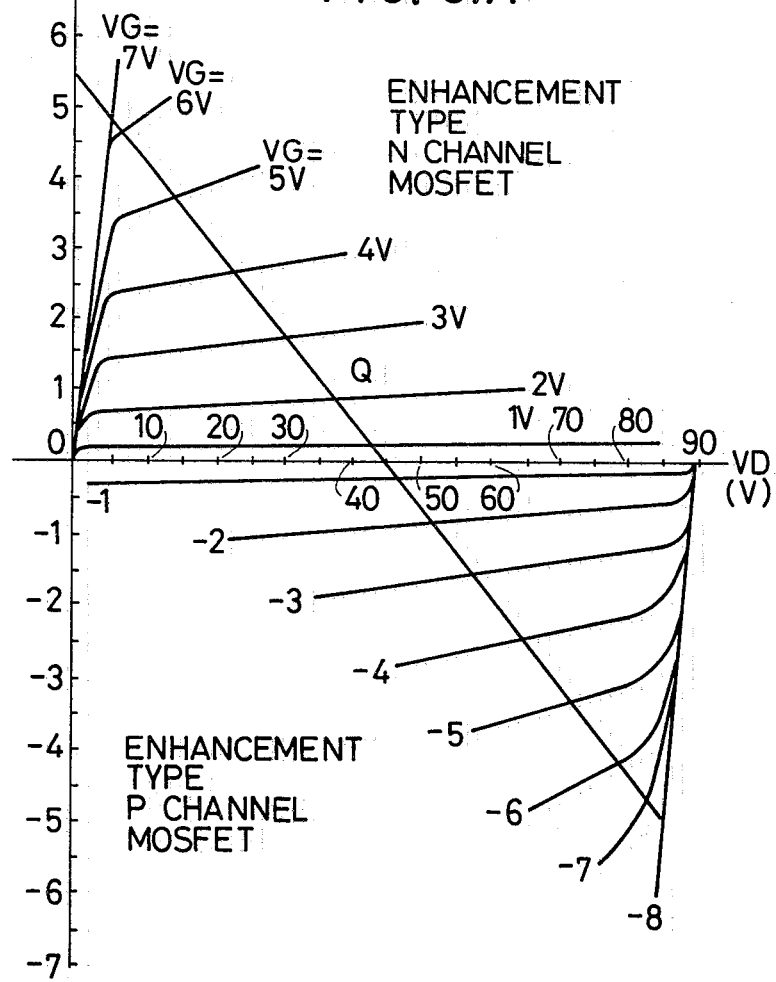

The output circuit employing the power MOSFET's according to this invention as shown in FIG. 35 can execute a complementary operation on the basis of the $V_D$–$I_D$ characteristics and load lines Q of both the MOSFET's as illustrated in FIG. 37A. In order to reduce the distortion of an output signal to the utmost in such a circuit, it is desirable to make the electrical characteristics of both the MOSFET's uniform. In this respect, the drain current of each of the MOSFET's has a negative temperature coefficient versus heat in a comparatively large current region. Therefore, even when there are slight discrepancies in the manufacturing process, the MOSFET's operate in the direction in which the characteristics can compensate for each other owing to the difference in the heat generated in the internal parts.

In the circuit arrangement shown in FIG. 35, the MOSFET has a positive temperature coefficient in a region of small drain currents, and a negative temperature coefficient in the region of comparatively large drain currents as stated above. Owing to these facts, the gate bias voltage can be determined with a circuit whose temperature coefficient is substantially zero, such as ordinary resistance, without using a circuit having a great temperature coefficient such as a thermistor, diode and transistor circuit. In this case, the idling current can be automatically determined by selecting the bias voltage between the two gates $G_1$ and $G_2$ in a range in which the drain current has the positive temperature coefficient. Since, in the gate bias voltage range, the drain current has the positive temperature coefficient, it is increased by the heat generation of the MOSFET itself. The increase in the drain current changes the temperature coefficient from the positive one to the negative one. As a result, the idling current is automatically adjusted. Conversely, in a gate bias voltage region in which the drain current has the negative temperature coefficient, the drain idling current is determined by a value reduced by the heat generation of the MOSFET due to the drain current.

Owing to the automatic adjustment action for the idling current of the MOSFET, no resistance is used between the source electrode and the load $R_L$ in the circuit of FIG. 35. Accordingly, the number of circuit elements used is smaller. Since the circuit of FIG. 35 includes no resistance in the drain-source path, it undergoes no voltage loss due to a resistance and can effectively utilize the supply voltage.

The automatic adjustment action for the drain current appears more intensely in a case where no resistance is incorporated, than in case where a resistance is incorporated in series with the source. It has been revealed that the IGFET's for high power fabricated by the structures shown in the various figures have a temperature coefficient of zero for drain current values of approximately 0.07 to 0.1 A. It has therefore become apparent that the method of setting the idling current by the automatic adjustment action can be adopted.

In this manner, in the circuit arrangement shown in FIG. 35, the idling current can be controlled by the bias circuit of comparatively simple construction. In particular, in a power MOSFET which has a great gate width, the second gate of a semiconductor substrate is connected to the source. With this fact taken into account, the MOSFET has a capacitance of about 1,000 pF between the gate and source or between the gate and substrate. Using the bias circuit arrangement as shown in FIG. 35, therefore, the gate of each MOSFET can be charged without the intervention of the variable resistance $R_G$, and hence, the charging time shortens. Thus, troubles which are ascribable to the phase difference between input and output signals and which become a problem especially in sound equipment and appliances can be eliminated.

Figure 37B:
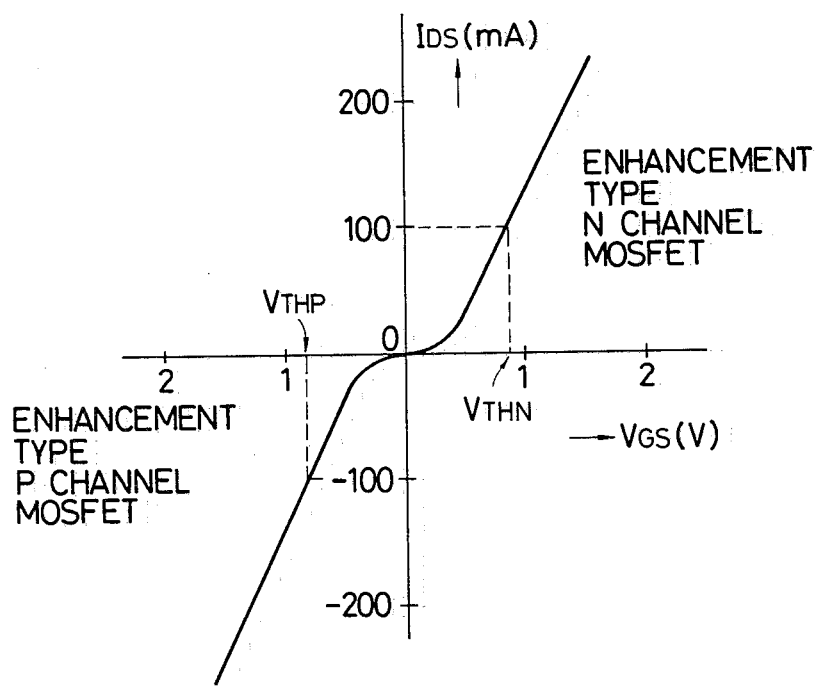

FIG. 37B illustrates the input/output characteristics ($V_{GS}$–$I_{DS}$ characteristics) of both the MOSFET's. When the values of the gate voltage $V_{GS}$ at a certain predetermined minute current, for example, $I_{DS} = 100$ mA, are defined to be the threshold voltages $V_{THp}$ and $V_{THn}$ of the P-channel and N-channel MOSFET's respectively, it is desirable that the MOSFET's to be used be selected so as to fulfill the condition of $V_{THn} - V_{THp} \geq 0$. In view of the ease $V_{TH}$ control, the discrepancy in characteristics, the yield, etc. in the actual process for manufacturing the N- and P-channel MOSFET's, it is more desirable that both the MOSFET's be the enhancement type and that, as to the bias, the idling current $I_{idle}$ be controlled by controlling the variable resistance $R_G$ as illustrated in FIG. 35.

As previously stated, in case of using an N-channel MOSFET and a P-channel MOSFET is a pair, especially as in the SEPP circuit of the complementary MOSFET's shown in FIG. 35, it is desirable, in view of improving the distortion characteristics etc., that the electrical characteristics of both the MOSFET's, for example, the breakdown voltage, the current ("on" resistance), the mutual conductance, etc. be made uniform. The inventors conducted various experiments in order to satisfy this requirement. As a result, it has been found out that the device parameters of the N-channel and P-channel elements used to be selected as described below.

(1) Regarding the drain-source breakdown voltage characteristic:

In order to attain a high drain-source breakdown voltage, the offset gate region needs to be disposed as stated above. N-channel and P-channel MOSFET's having various lengths $L_{Reff}$ of offset gate regions were manufactured by way of trial. As a result, it was revealed that when the lengths $L_{Reff}$ are equal, a negative resistance is prone to arise in the N-channel MOSFET as stated previously, and that, due to the negative resistance, the drain-source breakdown voltage $BV_{DS(n)}$ of the N-channel MOSFET is lower than that $BV_{DS(p)}$ of the P-channel MOSFET. It has been revealed that in order to prevent the occurrence of the negative resistance and to bring the breakdown voltage $BV_{DS(n)}$ of the N-channel MOSFET close to the breakdown voltage $BV_{DS(p)}$, the length $L_{Reff(n)}$ of the N-channel MOSFET needs to be made greater than the length $L_{Reff(p)}$ of the P-channel MOSFET, thereby to lessen the electric field strength in the semiconductor surface of the N-channel MOSFET. In particular, by making the length $L_{Reff(n)}$ about 1.5 to 6 times greater than the length $L_{Reff(p)}$, the drain-source breakdown voltage $BV_{DS}$ of both the MOSFET's could be made substantially equal. This is attributable to the fact that electrons and holes exhibit different ionization rates $\alpha$ (for example, $\alpha_n \approx 6 \times \alpha_p$ in an electric field $E = 2.9 \times 10^5$ V/cm) in the positive feedback loop as stated previously, so the avalanche phenomenon situation differs between the N- and P-channel MOSFET's. It is thought that, by making the length $L_{Reff(n)}$ greater than the length $L_{Reff(p)}$, the mean field strength $(E = V_{DS}/L_{Reff})$ in the offset gate region of the N-channel MOSFET can be made lower than that in the offset gate region of the P-channel MOSFET, the ionization rate of electrons $\alpha_n$ being lowered to that extent, with the result that the breakdown voltages of both the MOSFET's can be made uniform.

(2) Regarding the mutual conductance $g_m$:

Further, the inventors carried out tests and experiments on the mutual conductance $g_m$ which is one important factor in determining the symmetry of the N- and P-channel MOSFET's. As a result, it has been revealed that in order to make the $g_m$ characteristics of both the MOSFET's equal, the channel widths W, channel lengths $L_C$ and insulating film thicknesses $t_{ox}$ of both the MOSFET's may be set as described below.

$$\frac{W_{(n)}}{t_{ox(n)} \cdot L_{C(n)}} : \frac{W_{(p)}}{t_{ox(p)} \cdot L_{C(p)}} = 1 : 1.3 \text{ to } 3.5$$

where $W_{(n)}$ and $W_{(p)}$ denote the channel widths of the N- and P-channel MOSFET's respectively, $t_{ox(n)}$ and $t_{ox(p)}$ the thicknesses of the gate insulating films of the N- and P-channel MOSFET's respectively, and $L_{C(n)}$ and $L_{C(p)}$ the channel lengths of the N- and P-channel MOSFET's, respectively.

It has further been revealed that when the dispersion, stability, yield etc. in the actual process for fabricating elements are taken into account, the value $W/t_{ox} \cdot L_C$ of the P-channel MOSFET is desirably set at about 1.8 to 2.8 times that of the N-channel MOSFET.

The above characterizing item has been explained for case where, in view of the actual process of manufacture, gate insulating films of an identical material such as $SiO_2$ are employed in both the MOSFET's. In case of using gate insulating films whose dielectric constants $\epsilon_{ox}$ are different from each other, the value $W \cdot \epsilon_{ox} L_C \cdot t_{ox}$ of the P-channel MOSFET may be set, with the difference of the dielectric constants also taken into account, at about 1.3 to 3.5 times that of the N-channel MOSFET, more desirably at about 1.8 to 2.8 times.

In order to make the pellet sizes or chip sizes for both the MOSFET's to be fabricated as small as possible and to make the drain currents $I_{DS}$ at an identical drain voltage equal in both the MOSFET's, it is desirable to make the channel width W of the P-channel MOSFET greater than that of the N-channel MOSFET, for example, about 1.8 to 2.5 times greater. In order to make the chip sizes for both the MOSFET's as small as possible and to render the "on" resistances to the same extent, it is desirable to make the channel length $L_C$ of the N-channel MOSFET greater than that of the P-channel MOSFET, for example, about 1.1 to 1.5 times greater.

(3) In order to attain equal drain-source breakdown voltages $BV_{DS}$ in both the MOSFET's, it is necessary to make the impurity concentrations of the offset gate regions 4 constant. However, since the surface of the silicon substrate including the surface of the offset gate region is covered with the silicon dioxide film, the surface of the offset gate region directly under the film is rendered the N-type. With this fact in mind, it is desirable that the impurity concentration $N_{DS}$ (or the quantity of ion implantation in silicon) in the offset gate region 4 of the P-channel MOSFET be set higher than in the N-channel MOSFET, for example, about 1.5 to 2.2 times higher.

In a case where the characteristics of complementary MOSFET's for high power are to be made uniform, the uniformity can be achieved by any one or combination of the techniques (1), (2) and (3) in accordance with the necessary degree.

Table 1 exemplifies the device parameters of an N-channel MOSFET and a P-channel MOSFET designed in consideration of the above requirements.

TABLE 1

| Device parameters of N- and P-channel MOSFET's | | | |
|---|---|---|---|
| | Unit | N-channel MOSFET | P-channel MOSFET |
| Offset gate length, $L_{Reff}$ | μm | 17 | 5 |
| Channel length, $L_C$ | μm | 7 | 6 |
| Channel width, W | cm | 18 | 36 |
| Impurity concentration of the offset gate region | cm$^{-2}$ | $1.0 \times 10^{12}$ | $1.8 \times 10^{12}$ |
| Thickness of the gate insulating film, $t_{ox}$ | nm | 130 | 130 |
| Chip size | mm × mm | 4.5 × 4.5 | 5.0 × 5.0 |

TABLE 1-continued

| Device parameters of N- and P-channel MOSFET's | | | |
|---|---|---|---|
| | Unit | N-channel MOSFET | P-channel MOSFET |
| Pitch of one set of drain and source, C | μm | 116 | 82 |

In this concrete example, the value $W/t_{ox} \cdot L_C$ of the P-channel MOSFET is about 2.3 times that of the N-channel MOSFET. Electrical characteristics obtained as the result are given in Table 2.

TABLE 2

| Comparisons between the electrical characteristics of N- and P-channel MOSFET's | | | |
|---|---|---|---|
| Characteristics | Unit | N-channel MOSFET | P-channel MOSFET |
| Drain - source breakdown voltage, $BV_{DS}$ | V | 220 | 200 |
| Drain current, $I_{DS}$ | A | 7 | 7 |
| Mutual conductance, $g_m$ | | 1.0 | 1.0 |
| "on" resistance | Ω | 1.2 | 1.2 |
| Input capacitance | $p^F$ | 600 | 850 |

It is understood from Table 2 that the characteristics of the pair of the N- and P-channel MOSFET's are equal except for the gate input capacitance. More uniform gate input capacitances can be simply achieved by increasing the length $L_C$ and the width W of the N-channel MOSFET to the extent that the other characteristics are not changed at all.

Figure 39:
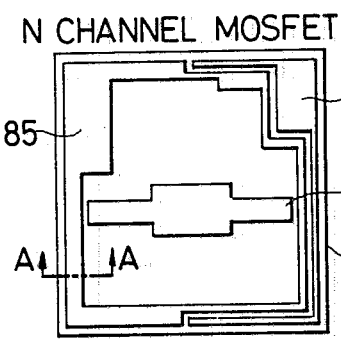
FIGS. 39 and 40 are plan views of semiconductor devices.
Figure 40:
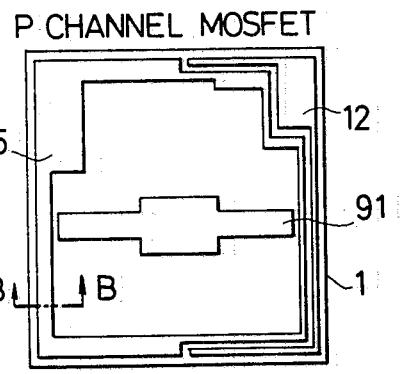
Figure 41:
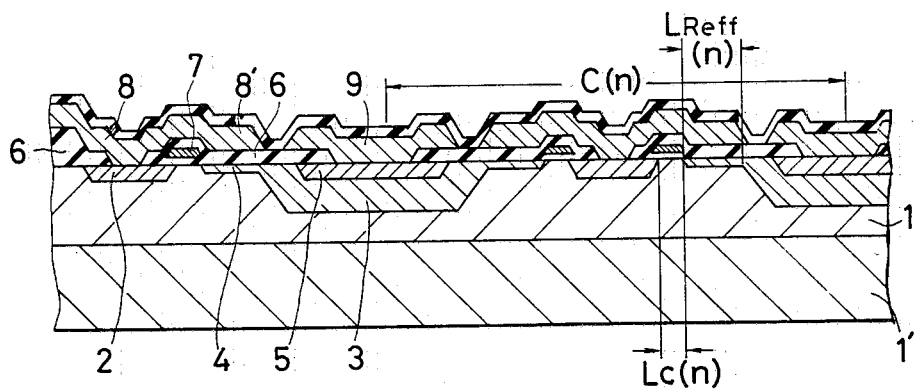
FIGS. 41 and 42 are sectional views of the essential portions of the devices taken along line A—A in FIG. 39 and line B—B in FIG. 40, respectively.
Figure 42:
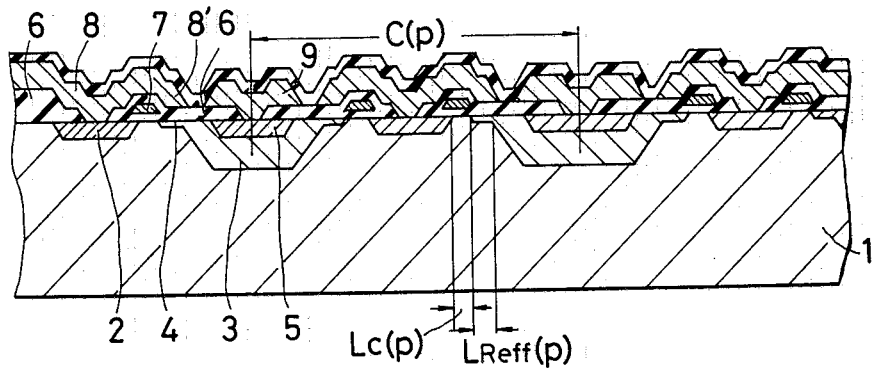

FIGS. 39 and 40 show by comparison and on the same reduced scale the outlines of the chip top plans of an N-channel MOSFET and a P-channel MOSFET which are respectively designed with the parameters of Table 1 so as to make the pair characteristics uniform. FIGS. 41 and 42 show by comparison and on the same reduced scale the sections of the essential portions of the elements as respectively taken along line A—A in FIG. 39 and line B—B in FIG. 40.

As apparent from these figures, in the complementary MOSFET's for high power with the uniform characteristics, notwithstanding that the N-channel MOSFET is greater than the P-channel MOSFET in both the offset gate length $L_{Reff}$ and the pitch C formed by one set of the source and the drain arranged in the mirror image symmetry, the chip size thereof may conversely be smaller. As seen from FIGS. 41 and 42, the N-channel type MOSFET employs a semiconductor substrate in which a P$^-$-type silicon epitaxially-grown layer of high resistivity 1 is formed on a P$^+$-type silicon sibstrate of high conductivity 1', whereas the P-channel MOSFET does not employ such an epitaxial layer. Therefore, in fabricating the complementary MOSFET's for high power having the uniform characteristics as described above, the P-channel MOSFET's can be obtained at lower cost and at higher yield, and the price of both types of MOSFET's can be reduced as a whole.

The manner of approach and the concept for making uniform the characteristics of both the P-channel and N-channel MOSFET's as stated above are applicable, not only to the MOSFET's of the structures shown in FIGS. 1 to 3, but also to an offset gate MOSFET of the type wherein the intermediate impurity region 3 is omitted and wherein the offset gate region 4 is disposed in direct contact with the drain region 5.

Figure 43:
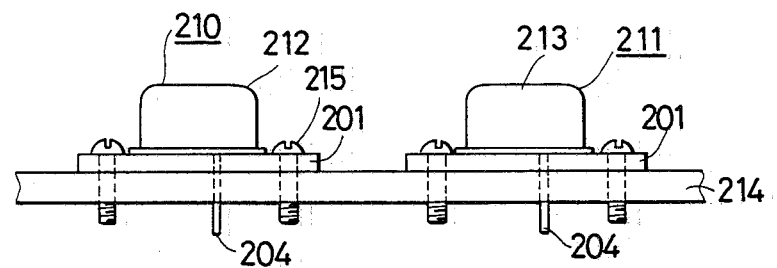
FIG. 43 is a front view showing the state of a semiconductor device as actually installed.

Such pair of MOSFET's for high power are respectively and individually assembled as shown in FIG. 38. Thereafter, they are sealed by metallic caps 212 and 213 as shown in FIG. 43. The resultant N-channel MOSFET 210 and P-channel MOSFET 211 are rigidly secured to a fitting plate 214 by screws 215. At this time, in case of using the MOSFET's in a circuit in which all the semiconductor substrates and source electrodes of both the MOSFET's are electrically connected as explained in FIG. 35, both the MOSFET's are brought into the state of FIG. 38 in which the source electrode is connected to the metallic header 201 of the stem by the connector wire 207. Thus, it is possible to provide the complementary semiconductor device for high power in which the single metallic plate of good thermal conductivity is employed as the fitting plate 214 and the number of components is simply reduced as illustrated in FIG. 43. The fitting plate 214 functions as a common heat sink as well as a common output electrode terminal, and is also effective to maintain the thermal equilibrium between both the MOSFET's. Since no high voltage acts on the sources d.c.-wise, it becomes unnecessary to insert an insulating substance such as mylor between the stem header and the heat sink plate.

Figure 44:
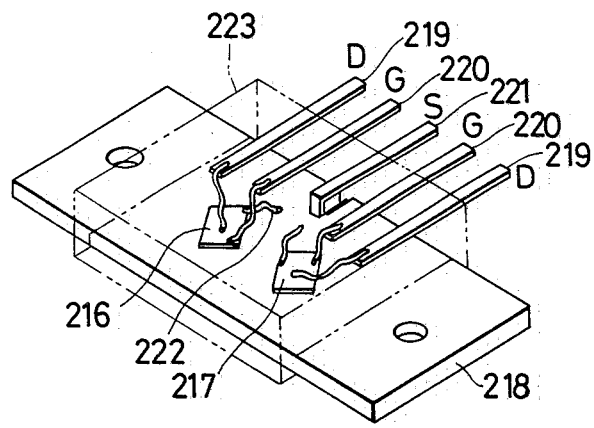
FIG. 44 is an assembly perspective view of a semiconductor device.

FIG. 44 is an assembly view of a pair of high power MOSFET's in which semiconductor chips 216 and 217 of the respective N- and P-channel MOSFET's are directly mounted on a common metal plate stem 218 and are connected to external leads 219 and 220 by connector wires, and in which both the chips are molded or encased in common by an insulating substance such as resin 223. Regarding a circuit device in which the semiconductor substrates (the so-called second gate electrodes) of both the MOSFET's are connected in common in such a manner, the assemblage of the components becomes comparatively simple, and thermal troubles can be solved comparatively easily. As previously described, the complementary MOSFET's of uniform characteristics can be assembled under in state under which the chip sizes are different between the N- and P-channel MOSFET's. Therefore, especially in the component assembling job as illustrated in FIG. 44, the chips of the N- and P-channel MOSFET's are easily discriminated between, so that the job efficiency is enhanced and the automatic assemblage is easily carried out.

It is a matter of course that this invention is not restricted to only the foregoing various aspects of performance, but that multifarious alterations and modifications are possible within a scope not departing from the technical idea of this invention.

We claim:

1. Combination of a P channel type insulated gate type field effect transistor and an N channel type insulated gate type field effect transistor having substantially the same electric characteristics except for the polarity thereof, each transistor having a source and a drain region formed in a semiconductor body, a low doped offset gate region of the same conductivity type as said drain region formed in the major surface of the body between the source and drain regions adjacent to the drain region, an insulating film formed on the major surface of said body, and a gate electrode formed on said insulating film so as to cover the major surface lying between said source region and said offset gate region and defining a channel area of the transistor, wherein the length of said offset gate region and the channel width of said N channel type transistor are made respectively larger and smaller than that of said P channel type transistor.

2. The combination according to claim 1, wherein said body for said N channel type transistor has further a low resistivity semiconductor region lying under said source and drain regions.

3. The combination according to claim 1, wherein the length of said offset gate region of said N channel type transistor is 1.5 to 6.0 times greater than that of said P-channel type transistor.

4. The combination according to claim 1, wherein the channel length of said N channel type transistor is 1.1 to 1.5 times greater than that of said P channel type transistor.

5. The combination according to claim 1, wherein a number calculated by an expression W/Tox·Lc, wherein W, Tox and Lc are the channel width, channel length and thickness of the gate insulating film in the P channel type transistor, respectively, is 1.8 to 2.8 times greater than that calculated in the N channel type transistor.

6. A circuit comprising a P channel type insulated gate field effect transistor and an N channel type insulated gate field effect transistor, each transistor having a source and a drain region formed in a semiconductor body, a low doped offset gate region of the same conductivity type as said drain region, a source electrode connected to said source region, a drain electrode connected to said drain region, a gate electrode formed on an insulating film covering the major surface defining the channel of the transistor between said source region and said offst gate region, and a substrate electrode means provided to said body, connecting means for directly connecting said source electrodes and substrate electrodes of said both transistors in common to an output terminal, bias adjusting means connected to said gate electrodes of said transistors, and means for applying an input signal to the gate electrodes coupled to said gate electrodes, wherein said N channel type transistor has a length of said offset gate region longer and a channel width smaller than said P channel type transistor.

7. An audio amplifier comprising a P channel type insulated gate field effect transistor and an N channel type insulated gate field effect transistor, each transistor having a source and a drain electrode and an insulated gate electrode, connecting means for connecting said source electrodes of both transistors in common to an output terminal, bias adjusting means connected to said gate electrodes of both transistors, means for supplying an input signal to said gate electrodes, and connecting means for connecting an audio speaker to said output terminal, wherein each said transistor has an offset gate region in a semiconductor body and said N channel type transistor has a length of said offset gate region longer and a channel width smaller than said P channel type transistor.

8. The invention according to claim 1, 6 or 7, wherein said offset gate region is shallower in depth than said source and drain regions.

* * * * *